(12) United States Patent
Sternklar et al.

(10) Patent No.: US 10,257,014 B2
(45) Date of Patent: Apr. 9, 2019

(54) METHOD AND SYSTEM FOR CONTROLLING PHASE OF A SIGNAL

(71) Applicant: Ariel-University Research and Development Company Ltd., Ariel (IL)

(72) Inventors: Shmuel Sternklar, Yakir (IL); Moshe Ben-Ayun, Shoham (IL)

(73) Assignee: Ariel-University Research and Development Company Ltd., Ariel (IL)

( * ) Notice: Subject to any disclaimer, the term of this patent is extended or adjusted under 35 U.S.C. 154(b) by 0 days.

(21) Appl. No.: 15/763,481

(22) PCT Filed: Oct. 6, 2016

(86) PCT No.: PCT/IL2016/051088
§ 371 (c)(1),
(2) Date: Mar. 27, 2018

(87) PCT Pub. No.: WO2017/060908
PCT Pub. Date: Apr. 13, 2017

(65) Prior Publication Data
US 2018/0278456 A1   Sep. 27, 2018

Related U.S. Application Data

(60) Provisional application No. 62/238,816, filed on Oct. 8, 2015.

(51) Int. Cl.
*H04L 27/36* (2006.01)
*G01R 25/04* (2006.01)
*H03C 3/40* (2006.01)

(52) U.S. Cl.
CPC ............ *H04L 27/361* (2013.01); *G01R 25/04* (2013.01); *H03C 3/40* (2013.01)

(58) Field of Classification Search
CPC ...... H04L 27/361; H04L 27/34; H04L 27/362; H04L 1/0071; H04L 25/03834;
(Continued)

(56) References Cited

U.S. PATENT DOCUMENTS 3,388,336 A   6/1968  Mattern
4,123,702 A   10/1978 Kinanen et al.
(Continued)

FOREIGN PATENT DOCUMENTS

WO   WO 2015/140610   9/2015
WO   WO 2017/060908   4/2017

OTHER PUBLICATIONS

Notification of Office Action dated Nov. 2, 2018 From the State Intellectual Property Office of the People's Republic of China Re. Application No. 201480077332.8 and Its Translation Into English. (12 Pages).
(Continued)

*Primary Examiner* — Zewdu A Kassa

(57) ABSTRACT

A method of amplifying a phase shift, comprises: receiving an input signal in response to an output signal; generating a reference signal; varying a modulation of at least one of the signals such that a ratio between modulation amplitudes of the input and reference signals is at least 0.9 and at most 1.1, and a phase difference between the reference and the input signals is from about 0.9 pi to about 1.1 pi; forming an output signal which comprises a sum of the reference and input signals, following the variation; and filtering the output signal by a bandpass filter to form a filtered output signal, wherein a bandwidth of the bandpass filter is selected such that XG<0.1, wherein X is a noise fluctuation average of the filtered output signal, and G is an expected amplification factor of a phase shift between the input and the reference signals.

27 Claims, 21 Drawing Sheets

(58) Field of Classification Search
CPC ......... H04L 1/0041; G01R 25/04; H03C 3/40; H04B 10/548; H04B 10/50577
USPC ................................ 375/298, 295, 316, 219
See application file for complete search history.

(56) References Cited

U.S. PATENT DOCUMENTS

| | | | |
|---|---|---|---|
| 4,287,606 | A | 9/1981 | Lutes, Jr. et al. |
| 4,596,965 | A | 6/1986 | Schiek et al. |
| 4,769,853 | A | 9/1988 | Goodwin et al. |
| 5,270,548 | A | 12/1993 | Steinkamp |
| 5,317,288 | A | 5/1994 | Yung et al. |
| 5,333,047 | A | 7/1994 | Toyama et al. |
| 5,659,272 | A | 8/1997 | Linguet |
| 6,157,037 | A | 12/2000 | Danielson |
| 6,285,288 | B1 | 9/2001 | Langdon et al. |
| 6,714,742 | B1 | 3/2004 | Hayee et al. |
| 7,187,183 | B2 | 3/2007 | Jonsson et al. |
| 7,715,730 | B2 | 5/2010 | Hecker et al. |
| 2001/0045513 | A1* | 11/2001 | Kourogi ............. G01N 21/4795 250/250 |
| 2006/0256344 | A1 | 11/2006 | Sikora et al. |
| 2006/0263098 | A1 | 11/2006 | Akiyama et al. |
| 2007/0065161 | A1 | 3/2007 | Miura et al. |
| 2007/0212075 | A1 | 9/2007 | Yin |
| 2007/0212079 | A1 | 9/2007 | Ooi et al. |
| 2008/0112710 | A1 | 5/2008 | Tanaka et al. |
| 2008/0181620 | A1 | 7/2008 | Sasaki |
| 2009/0041473 | A1 | 2/2009 | Nishihara et al. |
| 2009/0269080 | A1 | 10/2009 | Akiyam et al. |
| 2010/0034537 | A1 | 2/2010 | Zhang et al. |
| 2010/0080571 | A1 | 4/2010 | Akiyama et al. |
| 2010/0182588 | A1 | 7/2010 | Reime |
| 2012/0176596 | A1 | 7/2012 | Reime et al. |
| 2012/0308240 | A1 | 12/2012 | Akiyama |
| 2017/0170908 | A1 | 6/2017 | Sternklar et al. |

OTHER PUBLICATIONS

International Preliminary Report on Patentability dated Apr. 19, 2018 From the International Bureau of WIPO Re. Application No. PCT/IL2016/051088. (6 Pages).
International Preliminary Report on Patentability dated Sep. 29, 2016 From the International Bureau of WIPO Re. Application No. PCT/IB2014/066512.
International Search Report and the Written Opinion dated Jan. 18, 2017 From the International Searching Authority Re. Application No. PCT/IL2016/051088. (9 Pages).
International Search Report and the Written Opinion dated Mar. 26, 2015 From the International Searching Authority Re. Application No. PCT/IB2014/066512.
Notice of Allowance dated Apr. 4, 2018 From the US Patent and Trademark Office Re. U.S. Appl. No. 15/127,421. (10 pages).
Notification of Office Action dated Feb. 2, 2018 From the State Intellectual Property Office of the People's Republic of China Re. Application No. 201480077332.8 and Its Translation Into English. (13 Pages).
Official Action dated Jul. 26, 2017 From the US Patent and Trademark Office Re. U.S. Appl. No. 15/127,421. (14 pages).
Pending Processing International Search Report and the Written Opinion dated Jul. 16, 2014 From the International Searching Authority Re. Application No. PCT/IB2014/059995.
Supplementary European Search Report and the European Search Opinion dated Dec. 16, 2017 From the European Patent Office Re. Application No. 14886588.4. (9 Pages).
Vadde et al. "A Closed Loop Scheme for Phase-Sensitive Fluorometry", Review of Scientific Instruments, XP000524265, 66(7): 3750-3754, Jul. 1, 1995.

* cited by examiner

METHOD AND SYSTEM FOR CONTROLLING PHASE OF A SIGNAL

RELATED APPLICATIONS

This application is a National Phase of PCT Patent Application No. PCT/IL2016/051088 having International filing date of Oct. 6, 2016 which claims the benefit of priority under 35 USC § 119(e) of U.S. Provisional Patent Application No. 62/238,816 filed on Oct. 8, 2015.The contents of the above applications are all incorporated by reference as if fully set forth herein in their entirety.

The contents of PCT Patent Application No. PCT/IB2014/066512 filed on Dec. 2, 2014 (International Publication No. WO2015/140610), U.S. Provisional Patent Application No. 62/010,470 filed on Jun. 11, 2014, PCT Patent Application No. PCT/IB2014/059995 filed on Mar. 20, 2014, now withdrawn, and U.S. Provisional Patent Application No. 61/803,471 filed on Mar. 20, 2013, are all incorporated herein by reference in their entirety.

FIELD AND BACKGROUND OF THE INVENTION

The present invention, in some embodiments thereof, relates to signal manipulation and, more particularly, but not exclusively, to a method and system for controlling phase.

Phase controllers are devices configured to control the phase of a signal relative to some reference phase. Known in the art are systems including radiofrequency (RF) phase detectors that are used to measure phase differences.

Determination and/or control of phase are known for many applications. For example, U.S. Published Application No. 20010045513 teaches measurement of an internal structure by changing a phase difference between the two signals and detecting a change in light intensity due to interference. U.S. Published Application No. 20100182588 discloses use of the analog or digital phase shift controls in a system that determines a distance to a retro-reflective object by means of optical signals transmitted to and from the object. U.S. Pat. No. 4,123,702 discloses use of phase shift for the purpose of sorting out and classifying timber in terms of knots. U.S. Pat. No. 5,270,548 discloses a phase-sensitive flow cytometer, wherein a phase detector resolves modulated intensity signal into two signal components which respectively relate to fluorescence decay lifetimes of fluorescent emission spectra.

U.S. Pat. No. 7,187,183 discloses measuring moisture and salt content by measuring attenuation and phase shift of microwaves. U.S. Pat. No. 6,285,288 teaches polarizing signal beams to differ in phase by ninety degrees for the purpose of determining air flow direction and velocity of air. U.S. Published Application No. 20120176596 uses phase shift two signals to determine the transit time of light.

SUMMARY OF THE INVENTION

According to an aspect of some embodiments of the present invention there is provided a method of amplifying a phase shift. The method comprises: receiving an input signal in response to a transmitted output signal; generating a reference signal; varying a modulation of at least one of the signals such that a ratio between modulation amplitudes of the input signal and the reference signal is at least 0.9 and at most 1.1, and a phase difference between the reference signal and the input signal is from about $0.9\pi$ to about $1.1\pi$; forming an output signal which comprises a sum of the reference signal and the input signal, following the variation; and filtering the output signal by a bandpass filter to form a filtered output signal, wherein a bandwidth of the bandpass filter is selected such that XG<0.1, wherein X is a noise fluctuation average of the filtered output signal, and G is an expected amplification factor of a phase shift between the input signal and the reference signal.

According to some embodiments of the invention the method comprising measuring a phase of the output signal relative to the reference signal.

According to some embodiments of the invention the method comprises measuring a change of phase of the output signal over time.

According to some embodiments of the invention the bandwidth is of at most $f/\sqrt{G}$ wherein f is a frequency of the output signal.

According to some embodiments of the invention the method comprises repeating the variation and the formation, using the output signal for generating an input signal for the repetition.

According to some embodiments of the invention the input signal and the reference signal are optical signals, wherein the output signal is an electrical signal, and wherein the method comprises generating an electrical reference signal and repeating the variation and the formation, using the electrical output signal and the electrical reference signal.

According to an aspect of some embodiments of the present invention there is provided a system for amplifying a phase shift. The system comprises: a transmitter for transmitting output signal, and a receiver for receiving an input signal in response to the transmitted signal; a reference signal generator for generating a reference signal; a modulation circuit, configured for varying a modulation of at least one of the signals such that a ratio between modulation amplitudes of the input signal and the reference signal is at least 0.9 and at most 1.1, and a phase difference between the reference signal and the input signal is from about $0.9\pi$ to about $1.1\pi$; a signal combiner configured for summing the signals, following the variation; and a bandpass filter for filtering the output signal to form a filtered output signal, wherein a bandwidth of the bandpass filter is selected such that XG<0.1, wherein X is a noise fluctuation average of the filtered output signal, and G is an expected amplification factor of a phase shift between the input signal and the reference signal.

According to some embodiments of the invention the system comprises a phase detector circuit configured for measuring a phase of the output signal relative to the reference signal.

According to some embodiments of the invention the system comprises phase-change detector circuit configured for measuring a change of phase of the output signal over time.

According to some embodiments of the invention the bandwidth is of at most $f/\sqrt{G}$ wherein f is a frequency of the output signal.

According to some embodiments of the invention the system comprises an additional modulation circuit and an additional signal combiner configured for repeating the variation and the formation, using the output signal for generating as an input signal for the repetition.

According to some embodiments of the invention the input signal and the reference signal are optical signals, wherein the output signal is an electrical signal, and wherein the system comprises an electrical reference signal generator for generating an electrical reference signal, an electrical modulation circuit configured for varying a modulation of at least one of the electrical output signal and the electrical reference signal, and an electrical signal combiner for forming a linear combination of the electrical output signal and the electrical reference signal, following the variation.

According to some embodiments of the invention the linear combination is formed by a signal summing circuit.

According to some embodiments of the invention the linear combination is formed optically.

According to some embodiments of the invention the linear combination is formed by multiplying the signal to provide a multiplication signal, and extracting from the multiplication signal components being linearly proportional to each of the signals.

According to an aspect of some embodiments of the present invention there is provided a system for measuring an internal structure of an object. The system comprises the system as delineated above and optionally and preferably as further detailed below.

According to an aspect of some embodiments of the present invention there is provided a system for measuring a distance to an object. The system comprises the system as delineated above and optionally and preferably as further detailed below.

According to an aspect of some embodiments of the present invention there is provided a system for measuring a motion characteristic. The system comprises the system as delineated above and optionally and preferably as further detailed below.

According to an aspect of some embodiments of the present invention there is provided an interferometer system. The system comprises the system as delineated above and optionally and preferably as further detailed below.

According to an aspect of some embodiments of the present invention there is provided a system for measuring flow. The system comprises the system as delineated above and optionally and preferably as further detailed below.

According to an aspect of some embodiments of the present invention there is provided a radiofrequency transceiver. The system comprises the system as delineated above and optionally and preferably as further detailed below.

According to an aspect of some embodiments of the present invention there is provided an optical transceiver. The system comprises the system as delineated above and optionally and preferably as further detailed below.

According to an aspect of some embodiments of the present invention there is provided a communication system. The system comprises the system as delineated above and optionally and preferably as further detailed below.

According to some embodiments of the invention each of the reference signal and the input signal is carried by a carrier electrical signal, and wherein a modulation frequency of both the reference signal and the input signal is at least 10 times lower than a carrier frequency of the carrier electrical signal.

According to some embodiments of the invention each of the reference signal and the input signal is carried by a carrier ultrasound signal, and wherein a modulation frequency of both the reference signal and the input signal is at least 10 times lower than a carrier frequency of the carrier ultrasound signal.

According to some embodiments of the invention each of the reference signal and the input signal is carried by a carrier optical signal, and wherein a modulation frequency of both the reference signal and the input signal is at least 10 times lower than a carrier frequency of the carrier optical signal.

According to some embodiments of the invention each of the reference signal and the input signal is an unmodulated continuous wave carrier signal.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
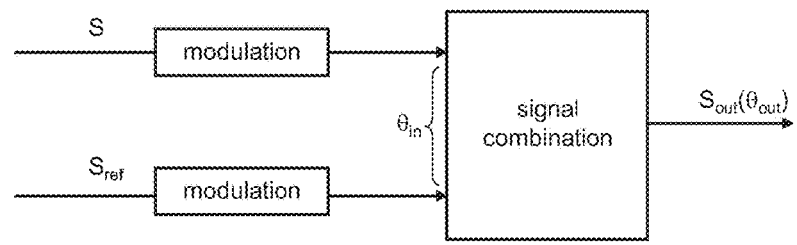
FIG. 1 is a schematic illustration describing the general principle of a technique for controlling the phase of a signal S relative to a reference signal $S_{ref}$, according to some embodiments of the present invention.

The present invention, in some embodiments thereof, relates to signal manipulation and, more particularly, but not exclusively, to a method and system for controlling phase.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

FIG. 1 is a schematic illustration describing the general principle of a technique for controlling the phase of a signal S relative to a reference signal $S_{ref}$, according to some embodiments of the present invention. The signals typically carry information in the form of some kind of modulation applied to a carrier wave. For example, when the information is carried, e.g., by amplitude modulation, each signal can be expressed mathematically as $A_i \cos(\Omega_i t + \theta_i) \exp(j\omega_i t)$, where $A_i$ is the respective modulation amplitude, $\Omega_i$ is the respective modulation frequency, $\theta_i$ is the respective modulation phase, $\omega_i$ is the respective carrier frequency and j is an imaginary number satisfying $j^2 = -1$. Typically, both the signal and the reference signal are modulated at the same modulation frequency $\Omega$. While the embodiments below are described with a particular emphasis to amplitude modulation, it is to be understood that any type of modulation can be employed for any of the embodiments described herein. In particular, any of the embodiments described herein can be applied to a signal modulated by frequency modulation, and any of the embodiments described herein can be applied to a modulated by phase modulation.

Each of the signals S and $S_{ref}$ can be either generated or received from an external source.

In some embodiments of the present invention, the modulation of the signals is such that there is phase difference $\theta_{in}$ between the modulation phases of the signals that is sufficiently small or sufficiently close to π radians.

As used herein, a phase difference $\theta_{in}$ is said to be "sufficiently small or sufficiently close to π radians" when the cosine of the phase difference $\theta_{in}$ satisfies the relation $C_{min} \leq |\cos(\theta_{in})| \leq 1$, where $C_{min}$ is at least 0.90 or at least 0.95 or at least 0.99 or at least 0.995 or at least 0.999 or at least 0.9995 or at least 0.9999.

As used herein, a phase difference $\theta_{in}$ is said to be "sufficiently close to π radians" when the cosine of the phase difference $\theta_{in}$ satisfies the relation $-1 \leq \cos(\theta_{in}) \leq -C_{min}$, where $C_{min}$ is at least 0.90 or at least 0.95 or at least 0.99 or at least 0.995 or at least 0.999 or at least 0.9995 or at least 0.9999.

In some embodiments of the present invention, it is not necessary for the phase difference $\theta_{in}$ to be very small or very close to π radians. In these embodiments, the cosine of the phase difference $\theta_{in}$ satisfies the relation $K_{min} \leq |\cos(\theta_{in})| \leq 1$, where $K_{min}$ is at least 0.5 or at least 0.6 or at least 0.7 or at least 0.8 or at least 0.89.

While FIG. 1 schematically illustrates that modulation is applied to both S and $S_{ref}$, this need not necessarily be the case, since, for some applications, the modulation is applied only to one of the signals, while the modulation of the other signal remains unchanged. Further, although the two signals are shown as entering and exiting a modulation block, this need not necessarily be the case, since for some applications, one or both of the signals can be generated by a signal generator that already provides the desired modulation for the respective signal.

The two signals are combined to form an output signal $S_{out}$ having a phase $\theta_{out}$ relative to the reference signal. The present inventor found that a judicious selection of $\theta_{in}$ and the ratio between the amplitudes of the signals can ensure that any change $\Delta\theta_{in}$ in $\theta_{in}$ results in a change in the modulation phase of $S_{out}$, relative to $S_{ref}$, which is substantially different from $\Delta\theta_{in}$, e.g., 10-10,000 times higher or 10-10,000 times lower than $\Delta\theta_{in}$.

This discovery by the present inventors is useful, for example, for increasing phase resolution, for example for the purpose of forming a phase-shifted signal.

Phase resolution can be defined in either absolute or relative manner.

In absolute manner, phase resolution can be viewed as the minimal realizable angular step between two adjacent phases on a phase axis, and in relative manner, phase resolution can be viewed as the ratio between two absolute phase resolutions. The advantage of relative phase resolution is that it can be defined irrespectively of the phase measuring device.

In the following, the term "phase-shift division factor" will be used to denote the ratio between a change in phase difference at the output and a corresponding change in phase difference at the input, where the phase difference at the output is the phase of the output signal relative to the reference signal, and the phase difference at the input is the phase of the signal relative to the same reference signal.

It is noted that since the phase differences at the input and at the output are with respect to the same reference, the term phase-shift division factor also characterizes a phase shifter system that receives an input signal having an input phase and provides an output signal having an output phase that equals the input phase multiplied by the phase-shift division factor.

According to this definition, lower values for the phase-shift division factor correspond to lower minimal angular steps on a phase axis at the output, namely higher absolute resolution, and higher values for the phase-shift division factor correspond to amplification of the phase difference at the output relative to the phase difference at the input.

The discovery by the present inventors is also useful for increasing phase shifts, for example for the purpose of measuring small phase shifts and/or small changes in phase shifts.

Following is a more detailed description of specific embodiments of the present invention, with reference to flowchart and block diagrams. It is to be understood that, unless otherwise defined, the operations described herein below can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously.

Additionally, several operations described below are optional and may not be executed.

Figure 2:
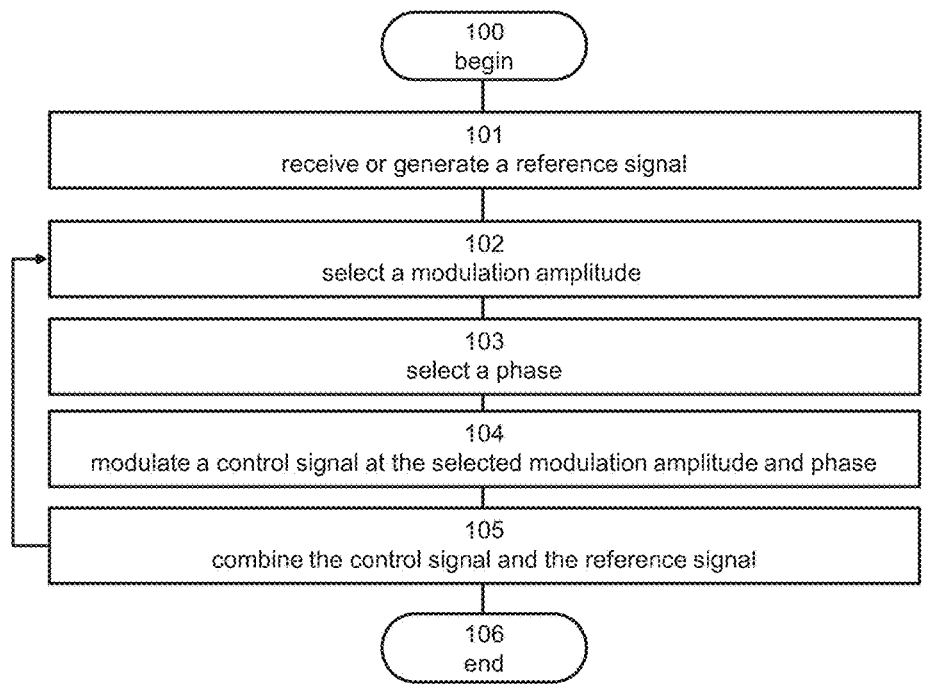
FIG. 2 is a flowchart diagram of a method suitable for generating a signal that is phase-shifted at a predetermined phase-shift division factor relative to a reference signal, according to some embodiments of the present invention.

FIG. 2 is a flowchart diagram of a method suitable for generating a signal that is phase-shifted at a predetermined phase-shift division factor relative to a reference signal, according to some embodiments of the present invention. The method begins at 100 and continues to 101 at which a reference signal $S_{ref}$ is generated or received. The method optionally and preferably continues to 102 at which a modulation amplitude is selected based on a predetermined phase-shift division factor. The predetermined phase-shift division factor can be received from a user or it can be stored or encoded in a circuit that selects the modulation amplitude. The predetermined phase-shift division factor is optionally and preferably less than 1. Representative values for a predetermined phase-shift division factor contemplated according to some embodiments of the present invention include, without limitation, 0.1 or less, or 0.01 or less, or 0.001 or less, or 0.0001 or less. Other, typically lower values are also contemplated.

As will be explained below (see 104 in FIG. 2) the selected amplitude is used for modulating a control signal. There is more than one way for selecting the amplitude. In some embodiments, the selected amplitude is proportional (e.g., linearly proportional) to the predetermined phase-shift division factor. For example, the selected modulation amplitude can be the amplitude of the reference signal multiplied by the predetermined phase-shift division factor. As a more specific example, the modulation amplitude can be selected to be g times smaller than the amplitude of the reference signal, where g is at least 5 or at least 10 or at least 50 or at least 100 or at least 500 or at least 1000. Other criteria for selecting the modulation amplitude are also contemplated. For example, a phase-dependent modulation amplitude or a set of predetermined modulation amplitudes can be selected, as is further detailed hereinunder.

The amplitude can be selected by the user numerically, or it can be tuned to its selected value by gradually varying the modulation amplitude of the control signal. Thus, operation 102 can be executed either before or after the control signal is generated.

The method optionally continues to 103 at which a modulation phase value relative to a modulation phase of the reference signal is selected. The phase value is preferably such that there is a predetermined phase difference $\theta_{in}$ between the phase $\theta_1$ of the reference signal and the selected phase $\theta_2$. In some embodiments, the predetermined phase difference $\theta_{in}$ satisfies $K_{min} \leq |\cos(\theta_{in})| \leq 1$, more preferably, but not necessarily, the predetermined phase difference $\theta_{in}$ satisfies $C_{min} \leq |\cos(\theta_{in})| \leq 1$, where $K_{min}$ and $C_{min}$ are as defined above.

When $\theta_{in}$ is close to 0, for example, when $|\theta_{in}|$ is less than 0.1 radians less than 0.01 radian or less than 0.001 radian, the modulation amplitude can be selected to be smaller, equal or larger than the amplitude of the reference signal. Modulation amplitude that is smaller than the amplitude of the reference signal (e.g., by a factor of g as further detailed hereinabove), is, however, preferred from the standpoint of obtaining a low value of the derivative $d\theta_{out}/d\theta_{in}$.

The phase value can be selected dynamically, during the execution of method 100, or it can be received as an input or be predetermined in which case 103 may be skipped.

The selection of modulation amplitude at 102 can be executed either before or after the modulation phase value is obtained. When the modulation amplitude is selected after the phase value is obtained (selected or received as input), the modulation amplitude is optionally selected also based on the modulation phase. For example, the method can select smaller modulation amplitudes for smaller modulation phases, according to some predetermined criteria.

The modulation phase value can be selected by the user numerically, or it can be tuned to its selected value by gradually varying the modulation phase of the control signal. Thus, operation 103 above can be executed either before or after the control signal is generated.

The method preferably continues to 104 at which a control signal is modulated at the selected modulation amplitude and phase. The control signal can be received from an external source, in which case the modulation 104 only modulates the control signal. If the control signal is received from the external source in a modulated form, modulation 104 manipulates the modulation of the control signal. The control signal can alternatively be generated by the method, in which case control signal can either be generated in a modulated form, or first be generated in an unmodulated form and then be modulated. In any event the final modulation of the control signal provided by 104 is characterized by the selected amplitude and phase value. Preferably, both the control signal and the reference signal are modulated at generally the same (e.g., within less than 1% or less than 0.1% or within less than 0.01%) modulation frequency.

In various exemplary embodiments of the invention the method continues to 105 at which the reference signal (which can enact signal $S_{ref}$ in FIG. 1) and the control signal (signal S in the present embodiments) are combined to form the phase-shifted signal $S_{out}$. Referring again to FIG. 1, the reference signal can enact signal $S_{ref}$, the control signal can enact signal S, and the phase-shifted signal can enact signal $S_{out}$.

The combination 105 is preferably executed to form a linear combination of the control and reference signals. This can be done electronically, using an electric circuit, or optically using an optical assembly as further detailed above. The linear combination can be obtained either directly, for example, using a signal summing circuit, or indirectly, for example, by signal multiplication followed by extraction of signal components that are linearly proportional to each of the reference signal and the control signal.

These two embodiments can be formulated mathematically as follows.

Denoting the modulation of the reference signal by $A + a \cos(\Omega t + \theta_1)$ and the modulation of the control signal by $B + b \cos(\Omega t + \theta_2)$, a direct summation provides a summed signal $S_{out} = A + B + a \cos(\Omega t + \theta_1) + b \cos(\Omega t + \theta_2)$, where $\theta_2 - \theta_1 = \theta_{in}$. $S_{out}$ can be written as $D + E \cos(\Omega t + \theta_{out})$, where $D = A + B$, and where E and $\theta_{out}$ depend upon the amplitudes and phases at the input. Within a preferred linear region of operation, the output signal $S_{out}$ is phase shifted relative to the reference signal $\theta_1$, at the amount of $\theta_{out} - \theta_1$, where $\theta_{out} - \theta_1$ is approximately equal to $(b/a) (\theta_2 - \theta_1)$.

In the embodiments in which signal multiplication is employed, the multiplication provides a signal $AB + Ab \cos(\Omega t + \theta_2) + Ba \cos(\Omega t + \theta_1) + ab \cos(\Omega t + \theta_1)\cos(\Omega t + \theta_2)$, which has two terms that are linearly proportional to the control and reference signals (the second and third terms). These two terms can be extracted, for example, by filtering out the unwanted fourth term and optionally also the first term, to provide a signal $S_{out} = Ab \cos(\Omega t + \theta_2) + Ba \cos(\Omega t + \theta_1)$, which can be written as $D' + E' \cos(\Omega t + \theta_{out})$, where D' and E' are constants which are not necessarily the same as D and E obtained by direct summation, and $\theta_{out}$ is a phase that is the same as obtained by direct summation.

Thus, each of the above signal combination techniques provides an output signal that is phase-shifted by the same amount relative to the reference signal. It was found by the present inventor that the above procedure can be executed to ensure that the phase difference $\theta_{out} - \theta_1$ at the output is smaller than the phase difference $\theta_{in}$ at the input, so that the ratio between a change in $\theta_{out} - \theta_1$ and a change in $\theta_{in}$ is less than 1 and equals the desired predetermined phase-shift division factor.

In various exemplary embodiments of the invention the phase shift value and the modulation amplitude are selected at 102 and 103 such that the dependence of the output change on the input phase change is generally linear over a region that is sufficiently wide for the respective application employing the method.

As used herein "generally linear" means a deviation from linearity of at most 50% or at most 25% or at most 10% or at most 1%.

The advantage of having for having a generally linear dependence is that large deviations from linearity can reduce the resolution or amplification of the phase shift. Another advantage is that it is easier to control and operate the device when there is a generally linear dependence since higher-order signal analysis is not required.

In some embodiments of the present invention the width of the region over which the dependence of the output change on the input phase change is at least X radians, wherein X is optionally and preferably 0.01 or 0.05 or 0.1 or 0.2 or 0.3 or 0.4 or 0.5 or 0.6 or 0.7 or 0.8 or 0.9 or 1 or 1.1 or more.

The present Inventors contemplate embodiments in which both the modulation phase and the modulation amplitude are varied in a dependent manner, for example, such as to maintain a generally constant (e.g., within a variation of at most 30% or at most 20% or at most 10% or at most 5% or at most 1%) slope of $\theta_{out}$ as a function of $\theta_{in}$. The advantage of these embodiments is that the variation maintains also a generally constant amplitude at the output.

A generally constant slope can be maintained, for example, by selecting the variations of the modulation phase and the modulation amplitude such that the multiplication between the cosine of $\theta_{in}$ and the ratio between the amplitude of S and $S_{ref}$ remains generally constant (e.g., within a variation of at most 30% or at most 20% or at most 10% or at most 5% or at most 1%). A representative example for a procedure suitable for dependently varying modulation phase and the modulation amplitude is provided in the Examples section that follows. In the present embodiments, the variations are preferably simultaneous, but may also be executed sequentially, in any order, provided that the relation between the variation in the phase and the variation in the amplitude is selected to ensure that the slope of $\theta_{out}$ as a function of $\theta_{in}$ is generally constant.

From 105 the method can proceed to end 106, or repeat one or more of the above operations, preferably excluding 101. For example, the output signal $S_{out}$ can be used as a new reference signal with a new reference phase, based on which one or more of operations 102-105 can be re-executed. In these embodiments, a new control signal is optionally and preferably generated, with a re-selected amplitude, wherein the phase difference $\theta^{(2)}_{in}$ between the phase of the new reference signal and the phase of the new control signal satisfies $K_{min} \leq |\cos(\theta^{(2)}_{in})| \leq 1$ or more preferably, but not necessarily, $C_{min} \leq |\cos(\theta^{(2)}_{in})| \leq 1$, where $K_{min}$ and $C_{min}$ are as defined above. The new reference signal and the new control signal can then be combined to form a new output signal. When the criterion for re-selection of the amplitude is similar to the criterion for the previous selection of the amplitude, the new output signal has a new output phase which is further reduced. The present embodiments contemplate an array of a plurality of such repetitions, which thus provide an output signal with an output modulation phase that is substantially reduced relative to the phase-difference at the input.

Figure 3:
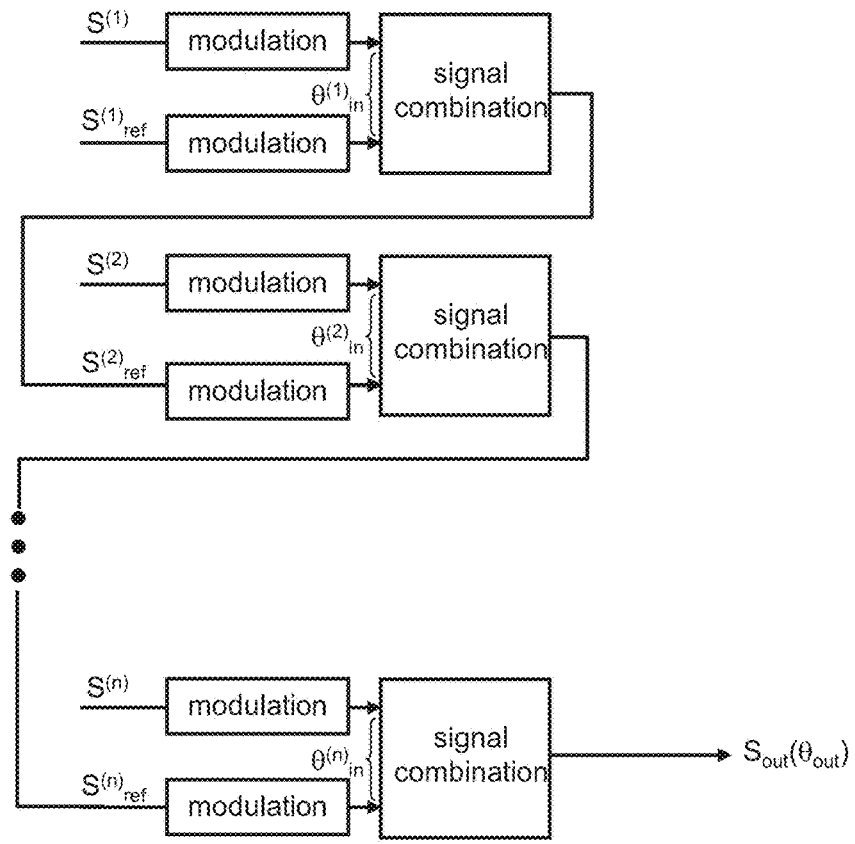
FIG. 3 is a schematic illustration of a repetition scheme, according to some embodiments of the present invention.

Such an array is illustrated in FIG. 3, in which at the kth level of the array, k=1, 2, . . . , n the reference signal is denoted $S^{(k)}_{ref}$, the control signal is denoted $S^{(k)}$ and the phase-difference between the control signal $S^{(k)}$ and the reference signal $S^{(k)}_{ref}$ is denoted $\theta^{(k)}_{in}$. For any k, $\theta^{(k)}_{in}$ preferably satisfies $C_{min} \leq |\cos(\theta^{(k)}_{in})| \leq 1$ or more preferably, but not necessarily, $C_{min} \leq |\cos(\theta^{(k)}_{in})| \leq 1$, where $K_{min}$ and $C_{min}$ are as defined above. For the first level, $S^{(1)}_{ref}$ is an input or initially generated signal, and for any other level (k>1) $S^{(k)}_{ref}$ is the output of the previous level (level k−1). The output of the nth array level is $S_{out}$ and its phase is denoted $\theta_{out}$.

The phase-shift division factor at the kth level, which can be set as the ratio between the changes in $\theta^{(k+1)}_{in}$ and in $\theta^{(k)}_{in}$, can be calculated based on the number n such that the accumulated phase-shift division factors of all the levels is the overall desired phase-shift division factor. The amplitude of $S^{(k)}$ can be selected based on the increment in phase phase-shift division factor at the kth level. As a representative example, suppose that a phase-shift division factor of 1/1024 is desired, so that any change in $\theta^{(1)}_{in}$ results in a change in $\theta^{(1)}_{out}$ that is 1024 smaller than the change in $\theta^{(1)}_{in}$. Suppose further that there are 10 array levels (namely n=10). According to this example, the phase-shift division factor in each level can be selected to be 0.5, so that the accumulated phase-shift division factor is $0.5^{10}=1/1024$. This can be achieved by selecting the amplitude of $S^{(k)}$ to be the same as $S^{(k)}_{ref}$ for any level k of the array.

It is to be understood that it is not necessary to calculate the amplitude and phase for $S^{(k)}$ dynamically during execution. Knowing the expected output at each level of the array, a set of amplitudes and a set of phases can be calculated in advance, and the amplitude and phase for $S^{(k)}$ can be selected from these sets.

In some embodiments, method 100 is executed dynamically wherein at least one of the phase shift $\theta_{in}$ and the amplitude ratio between the control and reference signals is dynamically varied in order to effect a controllable variation of the phase $\theta_{out}$ hence also the phase difference $\theta_{out}-\theta_1$.

Figure 4:
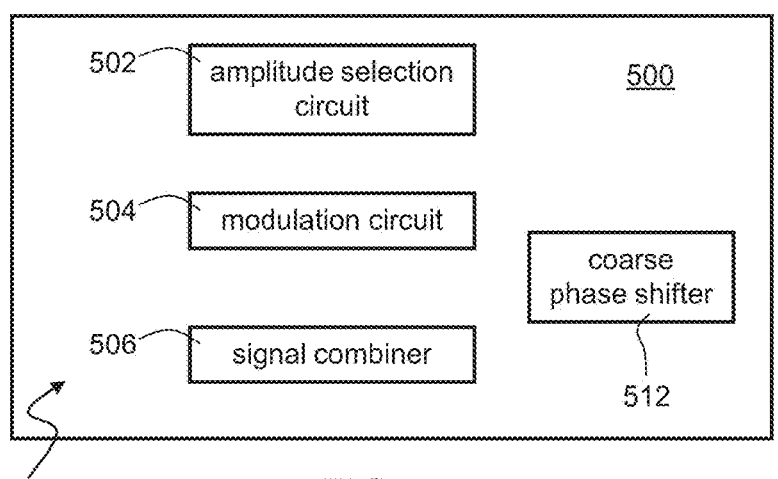
FIG. 4 is a schematic block diagram illustration of a phase shifter system, according to some embodiments of the present invention.

FIG. 4 is a schematic block diagram illustration of a phase shifter system 500, according to some embodiments of the present invention. Phase shifter system 500 is optionally and preferably configured for executing one or more operations of method 100 above. System 500 comprises an amplitude selection circuit 502, configured for selecting, based on the predetermined phase-shift division factor, a modulation amplitude. Circuit 502 preferably calculates the amplitude automatically from the phase-shift division factor and from the modulation parameters of the reference signal, as further detailed hereinabove.

System 500 can also comprise a modulation circuit 504, configured for modulating the control signal at the selected modulation amplitude, such that the phase difference $\theta_{in}$ between the phase $\theta_1$ of the reference signal and the selected phase $\theta_2$ satisfies $K_{min} \leq |\cos(\theta_{in})| \leq 1$, or more preferably, but not necessarily, $C_{min} \leq |\cos(\theta_{in})| \leq 1$, where $K_{min}$ and $C_{min}$ are as defined above. In some embodiments of the present invention circuit 504 is a signal generation and modulation circuit which is configured for generating at least one of the control signal and the reference signal. When circuit 504 generates the reference signal, circuit 502 receives from circuit 504 the phase and amplitude of the reference signal, and returns to circuit 504 the selected amplitude of the control signal. Circuit 504 optionally and preferably communicates with a user interface (not shown) that allows the user to select or tune the amplitude and/or phase, as further detailed hereinabove.

System 500 can also comprise a signal combiner 506, configured for combining the reference signal and the control signal as further detailed hereinabove.

In some embodiments, combiner 506 comprises a signal adder circuit. These embodiments are useful when the linear combination coefficient is positive (e.g., q=1).

In some embodiments, combiner 506 comprises a signal subtractor circuit. These embodiments are useful when the linear combination coefficient is negative (e.g., q=−1). In some embodiments, combiner 506 comprises a signal multiplier circuit. These embodiments are useful when the linear combination is obtained by multiplication followed by extraction of linear components as further detailed hereinabove.

In some embodiment combiner 506 is an optical assembly configured for performing a linear combination of two signals as known in the art. For example, the optical assembly may comprise a beam splitter followed by an optical detector. When the two signals to be combined are not-mutually coherent optical signals, the output of the detector of the optical assembly is the sum of the intensities of each of the beams. When the two signals to be combined are mutually coherent optical signals, the output from the optical detector of the optical assembly is the intensity of the summed electromagnetic field after the beam splitter. This typically introduces new cross-terms at the detector output which are proportional to the multiplication of the input signals, and can therefore be advantageous in terms of coherent amplification, further comprising for improving detection sensitivity and SNR.

Elements 502, 504 and 506 of system 500 thus form fine phase shifter circuitry referred to herein as circuitry 510. In some embodiments of the present invention System 500 can also comprise coarse phase shifter circuitry 512 for coarsely phase shifting the signal relative to the reference signal. The phase shift generated by coarse phase shifter circuitry 512 is larger than the phase shift generated at the output of fine phase shifter circuitry 510, so that the combined operation of circuitries 510 and 512 can provide an output signal having any phase relative to the reference signal at any resolution. The order of operations of circuitries 510 and 512 can be either such that the input signal is first phase shifted coarsely by circuitry 512 and then being phase shifted more finely by circuitry 512 or vice versa.

Figure 5:
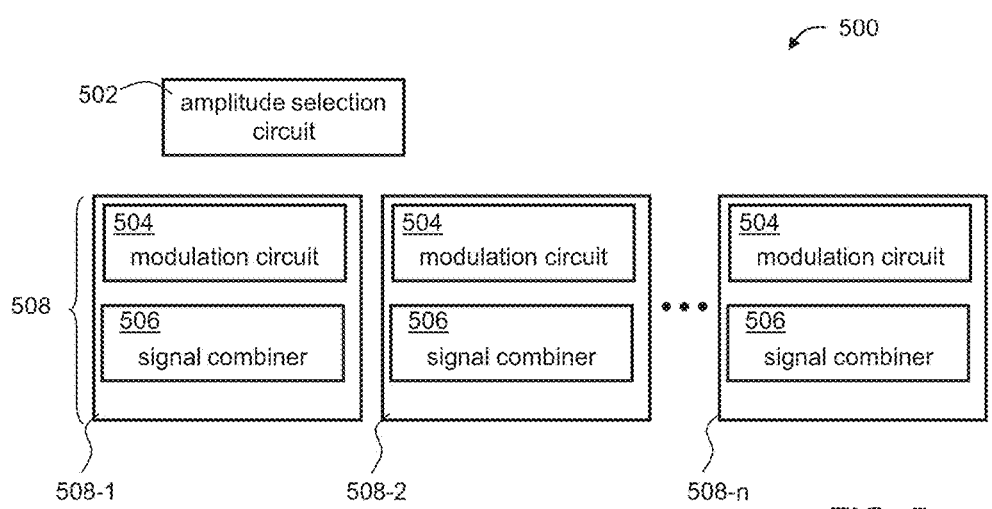
FIG. 5 is a schematic block diagram illustration of a phase shifter system, in embodiments of the invention in which the system comprises a circuitry array.

FIG. 5 is a schematic block diagram illustration of phase shifter system 500, in embodiments of the invention in which system 500 comprises a circuitry array 508. The principles of operations of the system according to these embodiments are as described above with reference to FIG. 3. Circuitry array 508 has a plurality of array elements 508-1, 508-2 etc, each having a respective modulation circuit 504 and a respective signal combining circuit 506, and may optionally, but not necessarily, also have a respective amplitude selection circuit. In accordance with the principles described above with reference to FIG. 3, a phase-shifted signal formed at each array element is used as a reference signal at a subsequent array element, if present.

Figure 6:
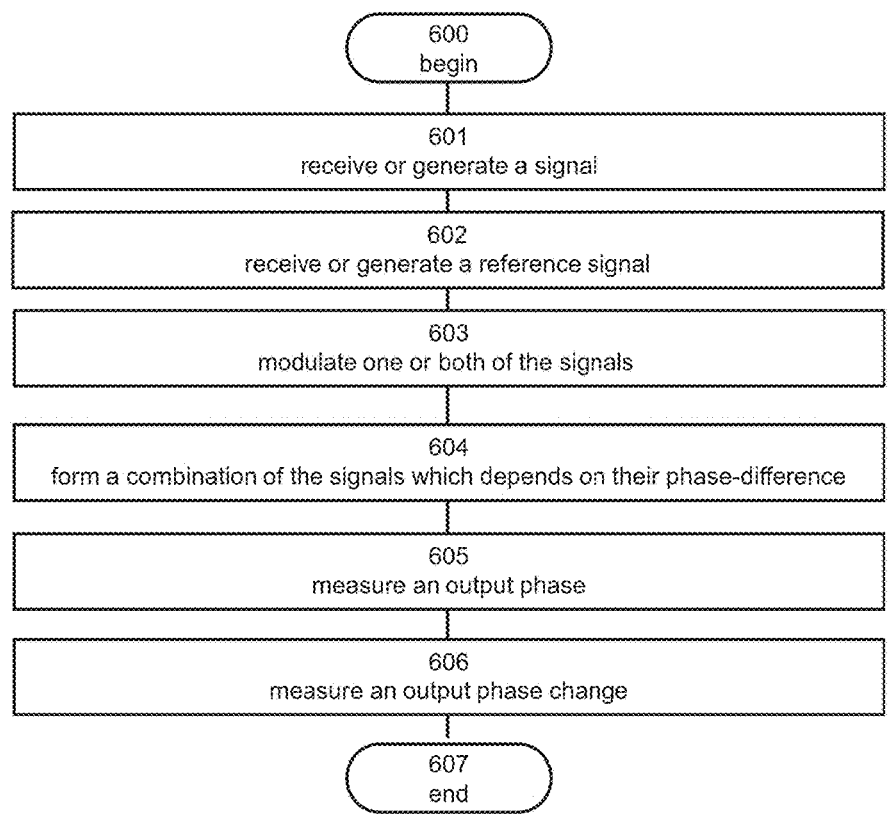
FIG. 6 is a flowchart diagram of a method suitable for amplifying a phase shift of a signal relative to a reference signal, according to some embodiments of the present invention.

FIG. 6 is a flowchart diagram of a method suitable for amplifying a phase shift of a signal relative to a reference signal, according to some embodiments of the present invention.

The method begins at 600 and continues to 601 at which a signal S is generated or received, and to 602 at which a reference signal $S_{ref}$ is generated or received. For example, one of the signals (e.g., signal S) can be received following an interaction of that signal with an object, and the other signal (e.g., signal $S_{ref}$) can be received via a path that does not allow it to interact with the object.

The time dependence of signals S and $S_{ref}$ can be mathematically formulated as $S(t)=S^0[1+n(t)]$ and $S_{ref}(t)=S^0{}_{ref}[1+n_{ref}(t)]$, where $S_0$ and $S^0$ ref are baseline levels of S and $S_{ref}$, respectively, and $n(t)$ and $n_{ref}(t)$ are relative noise fluctuations of S and $S_{ref}$, respectively. A relative noise fluctuation of a signal is defined as the fluctuation of the signal from its baseline, expressed as a fraction or multiplication of the baseline. The average (e.g., the Root-Mean- Square) of n(t) is denoted $\sigma_n$ and the average (e.g., the Root-Mean-Square) of $n_{ref}(t)$ is denoted $\sigma_{ref}$.

In various exemplary embodiments of the invention both signal S and reference signal $S_{ref}$ are characterized by generally the same (e.g., within 10%) relative noise fluctuation average. This can be ensured, for example, by using the same generator for generating $S_{ref}$ and for generating a transmitted output signal that interacts with an object to provide the signal S.

The method continues to 603 at which the modulation of at least one of the signals is varied. The variation is optionally and preferably with respect to the modulation amplitude such that the modulation amplitudes of the signal and the reference signal are sufficiently close to each other. Preferably, a ratio between modulation amplitudes of the signal and the reference signal is from about 0.9 to about 1.1, or from about 0.95 to about 1.05, or from about 0.99 to about 1.01, or from about 0.995 to about 1.005, or from about 0.999 to about 1.001 or from about 0.9995 to about 1.0005 or from about 0.9999 to about 1.0001.

It was found by the present Inventors that such a ratio can ensure phase shift amplification. The expected amplification factor G is typically about $1/\alpha$, where $\alpha$ is the absolute value of the difference between 1 and the ratio between modulation amplitudes of the signals. In some embodiments, G and the aforementioned noise fluctuation averages are selected such that their product is less than 0.4 or less than 0.3 or less than 0.2 or less than 0.1 or less than 0.01 or less than 0.001. Mathematically, this can be written as XG<q, where q=0.5 or 0.4 or 0.2 or 0.1 or 0.01 or 0.001, and where X=Max($\sigma_n$, $\sigma_{ref}$). Alternatively, the noise fluctuation averages can be higher, namely XG is not necessarily less than q. In these embodiments, a bandpass filter is optionally and preferably employed with sufficiently narrow bandwidth as further detailed hereinabove.

The variation is optionally and preferably also with respect to the modulation phase, such that the phase difference $\theta_{in}$ between the phase $\theta_1$ of the reference signal and the phase $\theta_2$ of the signal is sufficiently close to $\pi$ radians, as further detailed hereinabove.

Optionally, one of signals S and $S_{ref}$ is generated by selected operations of method 100 so as to ensure that the phase difference $\theta_{in}$ is sufficiently small or sufficiently close to $\pi$ radians. The amplitude(s) and phase(s) employed for the modulation variation can be selected by the method or be stored or encoded in a circuit that vary the modulation.

The method preferably continues to 604 at which an output signal $S_{out}$ which is a linear combination of the signals is formed. This can be done electronically, using an electric circuit, or optically using an optical assembly as further detailed below. The combination 604 can be done either directly, for example, using a signal summing circuit, or indirectly, for example, by signal multiplication followed by extraction of signal components that are linearly proportional to each of the signals, as further detailed hereinabove.

The linear combination can be generally written as $S_{out}=p(S+qS_{ref})$, where p is a normalization parameter, q is a linear combination coefficient and S and $S_{ref}$ are, respectively, the signal and reference signal following the modulation variation 603. The normalization parameter p can be set to any number, e.g., 1. The linear combination coefficient reflects the weight ratio of the two signals and is optionally and preferably selected based on the sign of the $\cos(\theta_{in})$. Generally, q is about 1 when $\cos(\theta_{in})$ is negative and about −1 when $\cos(\theta_{in})$ is positive. This can be written mathematically as $q \approx -\text{NINT}(\cos(\theta_{in}))$, where NINT is the nearest integer function and the ≈ sign is to be understood as within 10%. In other words, q optionally and preferably satisfies the conditions $\text{sign}(q) = -\text{sign}(\cos(\theta_{in}))$ and $0.91 \leq |q| 1.1$.

It was found by the present Inventors that the above procedure can ensure that the phase difference of the output signal relative to the reference ($\theta_{out} - \theta_1$) is amplified relative to the phase difference $\theta_{in}$. As demonstrated in the Examples section that follows, the amplification extent can reach the value of $1/\alpha$, where $\alpha$ is the absolute value of the difference between 1 and the ratio between modulation amplitudes of the signals. According to some embodiments of the present invention $\alpha$ can be at most 0.1 or at most 0.05 or at most 0.01 or at most 0.005 or at most 0.0001 or less, so that $\theta_{out}$ can be 10 times larger or 20 times larger or 100 times larger or 200 times larger or 1000 times larger or 2000 times larger or 10000 times larger than $\theta_{in}$.

The formed output signal is optionally and preferably filtered by a bandpass filter so as to improve the signal-to-noise ratio of the output signal. The bandwidth of the filter is preferably narrow. In some embodiments of the present invention the bandwidth BW of the filter is at most $f/\sqrt{G}$, where f is a frequency of the output signal. Preferably, the bandwidth BW of the filter is selected such that once the output signal is filtered the multiplication $\sigma_{out}G$ is less than q, where $\sigma_{out}$ is the noise fluctuation average (e.g., RMS) of the output signal.

It is to be understood that the operations described above can be repeated in iterative manner so as to provide a further amplification. In these embodiments, the formed output signal is used as the as the input signal for the repetition. Several representative realizations of such multiple amplifications are provided in the Examples section that follows.

In some embodiments of the present invention the method continues to 605 at which the phase of the output signal relative to the reference signal is measured. This can be done using any phase measuring technique known in the art. Representative examples including, without limitation, phase detectors that are commercially available from Mini-Circuits®, USA, and On Semiconductors®, USA.

In some embodiments of the present invention, the method continues to 606 at which a change over time of the phase of the output signal relative to the reference signal is measured. Operation 606 can be executed whether or not the phase of the output signal is known, since a change in a phase of a signal can be measured even when the signal's phase itself is not known. Thus, in some embodiments 605 is executed and 606 is not executed, in some embodiments both 605 and 606 are executed, in some embodiments 605 is not executed and 606 is executed, and in some embodiments none of 605 and 606 is executed.

The method ends at 607.

Figure 7:
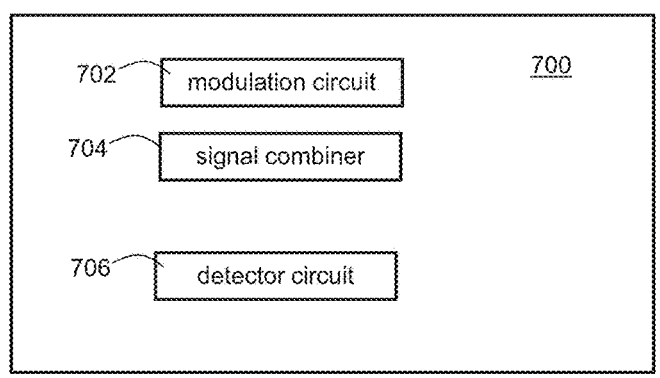
FIG. 7 is a schematic block diagram illustration of a system for amplifying a phase shift of a signal relative to a reference signal, according to some embodiments of the present invention.

FIG. 7 is a schematic block diagram illustration of a system 700 for amplifying a phase shift of a signal relative to a reference signal, according to some embodiments of the present invention. System 700 is optionally and preferably configured for executing one or more operations of method 600 above. System 700 comprises a modulation circuit 702, configured for varying a modulation of at least one of the signals as further detailed hereinabove. The amplitude(s) and phase(s) employed for the modulation variation performed by circuit 702 can be selected by system 700, for example, using an amplitude selection circuit (not shown, see FIG. 4), or be stored or encoded in circuit 702.

System 700 can also comprise a signal combiner 704, configured for forming an output signal $S_{out}$ which is a linear combination of the signals, as further detailed hereinabove. In some embodiments, combiner 704 comprises a signal adder circuit. These embodiments are useful when the linear combination coefficient is positive (e.g., q=1). In some embodiments, combiner 704 comprises a signal subtractor circuit. These embodiments are useful when the linear combination coefficient is negative (e.g., q=−1). In some embodiments, combiner 704 comprises a signal multiplier circuit. These embodiments are useful when the linear combination is obtained by multiplication followed by extraction of linear components as further detailed hereinabove.

In some embodiment combiner 704 is an optical assembly configured for performing a linear combination of two signals as known in the art, as further detailed hereinabove with respect to system 500.

In some embodiments of the present invention, system 700 comprises a detector circuit 706, which can configured as phase detector for measuring a phase of the output signal relative to the reference signal, or as a phase-change detector for measuring a change of phase of the output signal over time, or as a combined phase detector and phase-change detector for measuring both the phase of and its change.

System 500 and/or system 700 can be employed in many applications. Generally, one or both these systems can be used in any system in which it is desired to phase-shift a signal and/or to measure a phase shift of the signal. Representative examples of systems suitable for the present embodiments including, without limitation, a system for measuring an internal structure of an object, a system for measuring a distance to an object, a system for measuring a motion characteristic of an object, an interferometer system, a system for measuring flow of fluid (gas or liquid), a radiofrequency transceiver system, an optical transceiver system, a communication system, a signal generating system and the like.

As a representative example, system 500 and/or system 700 can be used in a sensing system that measures one or more characteristics of an object. In these embodiments, a modulated signal interacts with the object. Following the interaction, a change in the modulation of the signal is analyzed to extract one or more characteristics of an object, wherein the characteristics can relate to the structure of the object, the position of the object, the motion of the object or the thermal state of the object.

The transmission of modulated signal to the object can comprise using system 500 above for generating a predetermined phase shift between the transmitted modulated signal and a reference signal. The analysis can comprise detecting the phase of the signal received from the object. This can be done by amplifying the phase using system 700 and then analyzing the amplified phase as known in the art. The reference signal that is used for the amplification performed by system 700 can be generated by system 500. Thus, in these embodiments system 700 and system 500 operate in concert wherein system 500 generates a reference signal $S_{ref}$ at such a phase that ensures with a predetermined phase-shift division factor that the phase difference between the reference signal $S_{ref}$ and the received signal S is sufficiently small or sufficiently close to π radians, and system 500 combines the two signal to effect phase amplification.

The phase of the reference signal may depend upon one or more of the characteristics of an object and deviations from those one or more of the characteristics. For example, phase of the reference signal may depend upon the median position of the object and the small deviations from this position. Such deviations can be due to motion of a moving target object, to scanning of a set of points of a stationary target object, where the points on the target are at different depth positions, or to some combination of motion and varying depth locations of the scanned points on the target object.

There are various ways in which the correct value for the reference phase can be determined, one or more of which may be used in combination.

In some embodiments, the value of reference phase is changed in a controlled fashion (e.g., sawtooth, linear, sinusoidal or some other controlled scan of the values of the reference phase) using a phase shifter such as phase shifter system 500, while simultaneously monitoring the values of $\theta_{out}$. From these values of $\theta_{out}$ and with the aid of a priori knowledge of the characteristics of the graph of $\theta_{out}$ as a function of the reference phase and as a function of the deviation of $\theta_{in}$ from π or 0, and appropriate data processing, the value of the reference phase for which $\theta_{in}$ is sufficiently small or sufficiently close to π radians can be determined, and therefore the change in the position of the target object can be determined.

In some embodiments, the value of the reference phase is changed in a controlled fashion (e.g., sawtooth, linear, sinusoidal or some other controlled scan of the values of the reference phase) using a phase shifter such as phase shifter system 500 while simultaneously monitoring the values of the modulation amplitude B of the received signal, and with the aid of a priori knowledge of the characteristics of the graph of B vs. the reference phase and vs. the deviation of $\theta_{in}$ from 0 or π and appropriate data processing, the value of the reference phase for which $\theta_{in}$ is sufficiently small or sufficiently close to π radians. In some embodiments of the present invention the output signal is subjected to signal analysis responsively to a variation in $\theta_{in}$. The processing is optionally and preferably executed to determine the change in the deviation of $\theta_{in}$ from 0 or π. This change allows extracting information pertaining to the object from which the input signal is received. For example, when the system of the present embodiments is employed for measuring motion characteristics of the object, the change in the deviation of $\theta_{in}$ from 0 or π can be used for, e.g., extracting information pertaining to a change in distance to the object.

In some embodiments, the distance to the target object is measured using known techniques, and a value for the reference phase determined by such measurement is used as an input. Examples of known techniques which may be used to measure the distance to the target object include optical distance measurement techniques such as pulsed optical radar, phase-shift optical radar, and triangulation, linear encoding, and other optical or non-optical distance measurement means known in the art. However, in some cases, such known techniques measure the distance to the target object with lower precision than the method described herein. In addition to providing the thus determined value of the reference phase as input, use can be made of the embodiments described hereinabove in order to further zoom-in and determine more precisely the value of the reference phase.

In some embodiments, instead of or in addition to scanning of the value of the reference phase, the value of α is scanned. In some embodiments, instead of or in addition to monitoring the modulation phase of the output signal, the modulation amplitude of the output signal is monitored. Knowledge of the dependence of B on the deviation of $\theta_{in}$ from 0 or π (and therefore on the reference phase) as described in the examples section that follows (see, e.g., FIG. 12), allows the value of the physical parameter and its variation to be determined.

In some such embodiments, the received signal comprises a signal reflected from the object, e.g., by diffuse reflection or specular reflection. In some embodiments the received signal comprises a signal scattered from the object, in some embodiments, the scattering is selected from the group consisting of Rayleigh scattering, Mie scattering, Tyndall scattering, Brillouin scattering and Raman scattering. In some embodiments, the received signal comprises a signal absorbed by the object and re-emitted therefrom. In some embodiments, the interaction with the object comprises a linear interaction. In some embodiments the interaction with the object comprises a non-linear interaction. In some of the nonlinear interactions the object concurrently interacts with the generated modulated signal and another different signal, e.g., is illuminated with a light source that is not related to the modulated signal.

In some embodiments, the interaction of the modulated signal with the object results in a change of the signal type, such that the generated modulated signal is of one type and the received signal is of another type. For example, if the object is an optoelectronic device, such as a detector, the generated signal may be an electromagnetic signal entering the device, and the received signal may be an electric signal exiting the device. In some embodiments, such an optoelectronic device may be used as a sensor which is sensitive to a parameter P of another object, or a parameter of the optoelectronic device itself may be sensed.

In some embodiments, the object includes a physical parameter which causes the shift between the modulation phase of the transmitted modulated signal and the received signal.

In some embodiments, the physical parameter comprises change in time-of-flight of the generated signal during the interaction with the object. The physical parameter may be any physical parameter which affects the time of flight of the signal. For example, when the interaction with the object comprises transmission through a medium of the object, the change comprises a change in the time of flight of the signal during the time interval between entering and exiting the medium of the object, such as due to a different propagation velocity. As another example, when the interaction comprises reflection or scattering of the signal following impingement on the object, a change in time of flight can result when detecting impingement on a moving object as a result of changes in distance or when scanning a surface as a result of irregularities of the surface.

In some embodiments, the physical parameter comprises a change in the refractive index of the object or a medium thereof. In some such embodiments, any physical parameter that affects the refractive index may be monitored as described hereinbelow. Such physical parameters include, for example, electromagnetic carrier frequency of electromagnetic signals, stress, strain, temperature, electric field, magnetic field, material polarization, electromagnetic polarization, absorption, linear optical effects, nonlinear optical effects, linear electromagnetic effects, nonlinear electromagnetic effects (such as the presence of another electromagnetic field), and the presence or change of additional media such as biological media, organic media, inorganic media, hazardous or polluting media.

In some embodiments, the physical parameter comprises a change in the response time of the receipt of the signal from the object. For example, when the interaction with the object comprises absorption and retransmission of the signal by the object, certain characteristics or parameters of the object may change in the amount of time between the absorption of the signal and the retransmission thereof, resulting in a change in the response time of receipt of the signal from the object. As another example, when the interaction with the object comprises transmission through a medium of the object, the change in response time comprises a change in the response time of the medium in emitting the received signal after the generated modulated signal enters the medium.

The change in response time can be due to changes in one or more of the material parameters of the medium (such as electrical, mechanical, optical parameters of the medium, etc.), the parameters of the wave of the generated modulated signal (such as power, carrier frequency, modulation frequency, etc.), and/or external parameters (such as temperature, stress, strain, etc).

In some embodiments, the physical parameter comprises a parameter which causes a change in the absorption of the generated modulated signal by the object or by interaction therewith. In some embodiments the physical parameter comprises a parameter which causes a change in the amplification of the generated modulated signal by the object or by interaction therewith. In some embodiments the physical parameter comprises a parameter which causes a change in the scattering of the generated modulated signal by the object or by interaction therewith. In some embodiments the physical parameter comprises a parameter which causes a change in the reflection coefficient of the object. In some embodiments the physical parameter comprises a parameter which causes a change in the transmission coefficient of the object.

In some embodiments, the physical parameter comprises any one or more of a change in the carrier frequency (for example via a non-linear effect with the medium), temperature, stress, strain, voltage, radiation polarization, material polarization, and the presence or change of an additional media such as biological media, organic media, inorganic media, hazardous media, and polluting media.

In some embodiments, the object comprises an optical fiber or waveguide. In some embodiments the object comprises a metallic wire or waveguide. In some embodiments, the object comprises a radiation detector. In some embodiments, the object includes a medium comprising water. In some embodiments, the object includes a medium comprising an inorganic liquid. In some embodiments, the object includes a medium comprising an organic liquid. In some embodiments, the object includes a medium comprising a physiological medium, such as tissue, blood, saliva, urine, and the like. In some embodiments, the object comprises a semiconductor, and includes a semiconductor medium. In some embodiments, the object includes a medium comprising a gain medium, such as an optical gain medium, an electromagnetic gain medium, or an electric gain medium. In some embodiments, the object includes an interface between two types of media, for example an interface between a metallic medium and a dielectric medium.

In any of the above embodiments, any type of signal can be employed as a carrier for signals S and $S_{ref}$. In some embodiments, one or both signals is carried by an electromagnetic wave such as an optical beam, in some embodiments of the present invention one or both signals is carried by a mechanical wave (e.g., ultrasound signal, sonic signal, infrasonic signal), and in some embodiments one or both signals is carried by an electrical carrier (e.g., AC current) flowing in a conductive transmission line. The signals S and $S_{ref}$ can be carried by the same or different types of carriers, and the carrier frequencies of the signal S and $S_{ref}$ can be the same or they can differ.

For each of the signals S and $S_{ref}$, the modulation frequency can be the same or less than the carrier frequency of the respective signal. The modulation frequency of S and $S_{ref}$ can be in a sub-kilohertz range (e.g., 0.001 Hz-999 Hz), kilohertz range (e.g., 1 kHz-999 kHz), or a megahertz range (e.g., 1 MHz-999 MHz), or gigahertz range (e.g., 1 GHz-999 GHz). For example, modulation frequency of S and $S_{ref}$ can be in radiofrequency range (e.g., 3 Hz-300 MHz), or the microwave range (e.g., 300 MHz-300 GHz), or a sonic range (e.g., 20 Hz-20 kHz), or an ultrasonic range (e.g., 20 kHz-10 GHz or 20 kHz-5 GHz), or an infrasonic range (e.g., 0.001 Hz-20 Hz).

Any of the above types of signals can be generated by suitable signal generators as known in the art. For example, for an electromagnetic signal, a signal generator selected from the group of a function generator, an arbitrary waveform generator, an RF signal generator, a microwave signal generator, a vector signal generator, a logic signal generator, a radio transmitter, a vacuum tube, a klystron, a travelling-wave tube, a gyrotron, a magnetron, a field-effect transistor, a tunnel diode, a Gunn diode, IMPATT diode, a maser, backward wave oscillator, a synchrotron, a photomixer, a resonant tunneling diode, a laser, a LED and a lamp, can be used. For an acoustic signal, a signal generator selected from the group consisting of a pitch generator, an acoustic transmitter, a transducer, electro-acoustic transducer/array, a speaker, a loudspeaker, a subwoofer loudspeaker, a rotary woofer, an engine and a plasma sound-source can be used. For electrical signals, an electrical current modulator selected from the group of a pulse width modulator, a delta-sigma modulator, pulse-amplitude modulator, pulse-code modulator, pulse-density modulator, pulse-position modulator and a space-vector modulator can be used. In some embodiments, the signal generator comprises a digital computation component.

In some embodiments, the signals S and $S_{ref}$ are both electric signals. In some embodiments, one or more of the signals is non-electric (e.g., electromagnetic, mechanical) and in some embodiments is converted to an electric signal (e.g., by an electromagnetic detector or a mechanical wave detector) so that both S and $S_{ref}$ are eventually electric signals. In these embodiments, the output signal generator comprises an electronic summing circuit.

List of Optional and Preferred Embodiments

According to some embodiments of the present invention there is provided a method of generating a signal being phase-shifted at a predetermined phase-shift division factor relative to a reference signal. The method comprises: using the predetermined phase-shift division factor for selecting a modulation amplitude; modulating a control signal at the selected modulation amplitude, wherein a cosine of a phase difference between the reference signal and the control signal, in absolute value, is at least 0.5; and combining the reference signal and the control signal to form the phase-shifted signal.

According to some embodiments of the invention the invention the method comprises generating at least one of the control signal and the reference signal.

According to some embodiments of the invention the invention the method comprises selecting a value of a phase of the control signal based on the selected modulation amplitude.

According to some embodiments of the invention the invention the method comprises selecting a value of a phase of the control signal, wherein the selection of the modulation amplitude is based also on the selected phase.

According to some embodiments of the invention the invention the method comprises sequentially repeating the selection of the modulation amplitude, the modulation of the control signal and the combining at least once, each time using a previously formed phase-shifted signal as the reference signal.

According to some embodiments of the present invention there is provided a phase shifter system. The system comprises: an amplitude selection circuit, configured for selecting, based on a predetermined phase-shift division factor, a modulation amplitude; a modulation circuit, configured for modulating a control signal at the selected modulation amplitude, wherein a cosine of a phase difference between the reference signal and the control signal, in absolute value, is at least 0.95; and a signal combiner configured for combining the reference signal and the control signal to form a phase-shifted signal relative to the reference signal.

According to some embodiments of the invention the modulation circuit is a signal generation and modulation circuit configured for generating at least one of the control signal and reference signal.

According to some embodiments of the invention the invention the system comprises a circuitry array having a plurality of array elements, each having at least one of: a respective amplitude selection circuit, a respective modulation circuit and a respective signal combiner, wherein a phase-shifted signal formed at each array element is used as a reference signal at a subsequent array element, if present.

According to some embodiments of the invention the selected modulation amplitude is substantially smaller than a modulation amplitude of the reference signal.

According to some embodiments of the invention a ratio between the modulation amplitude of the reference signal and the selected modulation amplitude is at least 5. According to some embodiments of the invention a ratio between the modulation amplitude of the reference signal and the selected modulation amplitude is at least 10. According to some embodiments of the invention a ratio between the modulation amplitude of the reference signal and the selected modulation amplitude is at least 100. According to some embodiments of the invention a ratio between the modulation amplitude of the reference signal and the selected modulation amplitude is at least 1000.

According to some embodiments of the invention the combining comprises summing.

According to some embodiments of the invention the combining comprises multiplication to provide a multiplication signal, followed by extraction from the multiplication signal components being linearly proportional to each of the reference signal and the control signal.

According to some embodiments of the present invention there is provided a method of amplifying a phase shift of a signal relative to a reference signal. The method comprises: varying a modulation of at least one of the signals such that a ratio between modulation amplitudes of the signal and the reference signal is at least 0.9 and at most 1.1, and a cosine of a phase difference between the reference signal and the signal, in absolute value, is at least 0.95; and forming an output signal which is a linear combination of the reference signal and the signal, following the variation, the linear combination being characterized by a linear combination coefficient which is within 10% from an additive inverse of a nearest integer of the cosine.

According to some embodiments of the invention the method comprises generating at least one of the signals.

According to some embodiments of the invention the method comprises measuring a phase of the output signal relative to the reference signal.

According to some embodiments of the invention the method comprises measuring a change of phase of the output signal over time.

According to some embodiments of the present invention there is provided a system for amplifying a phase shift of a signal relative to a reference signal. The system comprises: a modulation circuit, configured for varying a modulation of at least one of the signals such that a ratio between modulation amplitudes of the signal and the reference signal is at least 0.9 and at most 1.1, and a cosine of a phase difference between the signal and the reference signal, in absolute value, is at least 0.95 and less than 1; and a signal combiner configured for forming a linear combination of the signals, following the variation, the linear combination being characterized by a linear combination coefficient which is within 10% from an additive inverse of a nearest integer of the cosine.

According to some embodiments of the invention the modulation circuit is a signal generation and modulation circuit configured for generating at least one of the signal and the reference signal.

According to some embodiments of the invention the system comprises a phase detector circuit configured for measuring a phase of the output signal relative to the reference signal.

According to some embodiments of the invention the system comprises a phase-change detector circuit configured for measuring a change of phase of the output signal over time.

According to some embodiments of the invention the linear combination is formed by a signal summing circuit.

According to some embodiments of the invention the linear combination is formed by a signal subtraction circuit.

According to some embodiments of the invention the linear combination is formed optically.

According to some embodiments of the invention the linear combination is formed by multiplying the signal to provide a multiplication signal, and extracting from the multiplication signal components being linearly proportional to each of the signals.

According to some embodiments of the present invention there is provided a system for measuring an internal structure of an object, comprising the system as delineated above and optionally and preferably as further detailed below.

According to some embodiments of the present invention there is provided a system for measuring a distance to an object, comprising the system as delineated above and optionally and preferably as further detailed below.

According to some embodiments of the present invention there is provided a system for measuring a motion characteristic, comprising the system as delineated above and optionally and preferably as further detailed below.

According to some embodiments of the present invention there is provided an interferometer system, comprising the system as delineated above and optionally and preferably as further detailed below.

According to some embodiments of the present invention there is provided a system for measuring flow, comprising the system as delineated above and optionally and preferably as further detailed below.

According to some embodiments of the present invention there is provided a radiofrequency transceiver, comprising the system as delineated above and optionally and preferably as further detailed below.

According to some embodiments of the present invention there is provided an optical transceiver, comprising the system as delineated above and optionally and preferably as further detailed below.

According to some embodiments of the present invention there is provided a communication system, comprising the system as delineated above and optionally and preferably as further detailed below.

According to some embodiments of the invention the absolute value of the cosine is at least 0.99. According to some embodiments of the invention the absolute value of the cosine is at least 0.995. According to some embodiments of the invention the absolute value of the cosine is at least 0.999. According to some embodiments of the invention the absolute value of the cosine is at least 0.9995. According to some embodiments of the invention the absolute value of the cosine is at least 0.9999.

According to some embodiments of the invention a modulation frequency of both the reference signal and the control signal is in a radiofrequency range. According to some embodiments of the invention a modulation frequency of both the reference signal and the control signal is in a sub-kilohertz range. According to some embodiments of the invention a modulation frequency of both the reference signal and the control signal is in a kilohertz range. According to some embodiments of the invention a modulation frequency of both the reference signal and the control signal is in megahertz range. According to some embodiments of the invention a modulation frequency of both the reference signal and the control signal is in gigahertz range.

According to some embodiments of the invention each of the signals is carried by a carrier electrical signal, wherein a modulation frequency of both the reference signal and the control signal is at least 10 times lower than a carrier frequency of the carrier electrical signal.

According to some embodiments of the invention each of the signals is carried by a carrier ultrasound signal, wherein a modulation frequency of both the reference signal and the control signal is at least 10 times lower than a carrier frequency of the carrier ultrasound signal.

According to some embodiments of the invention each of the signals is carried by a carrier optical signal, wherein a modulation frequency of both the reference signal and the control signal is at least 10 times lower than a carrier frequency of the carrier optical signal.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

Increment of Phase Resolution

As is well known in the art, the sum of two modulated signals (described by the formulas $A_1 \cos(\Omega t+\theta_1)$ and $A_2 \cos(\Omega t+\theta_2)$) having the same modulation frequency and different modulation phases, results in a new signal, having the same modulation frequency as the summed signals, and having a modulation amplitude and a modulation phase that depend upon the modulation amplitudes and modulation phases of the two summed signals, respectively, as described by the equation:

$$A_1 \cos(\Omega t+\theta_1)+A_2 \cos(\Omega t+\theta_2)=B \cos(\Omega t+\theta_{out}) \quad (1.1)$$

where $\Omega=2\pi f_m$ is the radial modulation frequency and $f_m$ is modulation frequency in Hz.

Using trigonometric identities, the modulation amplitude of the signal resulting from summing the two signals is shown to be:

$$B = A_1 \sqrt{1 + 2\hat{A}\cos(\theta_{in}) + \hat{A}^2} \quad (1.2)$$

and the modulation phase of the resulting signal is shown to be:

$$\theta_{out} = \theta_1 + tn^{-1} \frac{\hat{A}\sin(\theta_{in})}{1 + \hat{A}\cos(\theta_{in})} \quad (1.3)$$

where $\hat{A} \equiv \frac{A_2}{A_1}$ and $\theta_{in} = \theta_2 - \theta_1$.

In some embodiments, in order to control the phase of the output signal to high resolution, it is desired that changes to $\theta_{in}$ result in significantly smaller changes to $\theta_{out}$. The magnitude of reduction in change values between $\theta_{in}$ and $\theta_{out}$ can depend on the value of a modulation phase-shift division factor $F=1/g$.

In some embodiments, the ratio $\hat{A}$ of the modulation amplitudes of the summed signals is user-controlled, and is set to be $\hat{A}=1/g$ for a desired value of g such that g>1. Such embodiments can be analyzed algebraically for $\hat{A}$ which is significantly smaller than 1, mathematically described by $\hat{A} \ll 1$ so that g is significantly greater than 1, mathematically described as g>>1. In this case, equation (1.3) can be reduced to:

$$\theta_{out} \approx \theta_1 + \hat{A} \sin(\theta_{in}) = \theta_1 + \sin(\theta_{in})/g. \quad (1.4)$$

And therefore, for small phase changes the derivative of eq. (1.4) gives:

$$\Delta\theta_{out} = \frac{\Delta\theta_{in}}{g}\cos(\theta_{in}) \quad (1.5)$$

Analysis of equation (1.5) shows that in a certain range of $\theta_{in}$ for which $\cos(\theta_{in})$ does not change appreciably, such as when $\theta_{in}$ is substantially equal to $\pi$ or when $\theta_{in}$ is substantially equal to 0, $$\Delta\theta_{out} \propto \Delta\theta_{in}/g \quad (1.6)$$

Figure 8A:
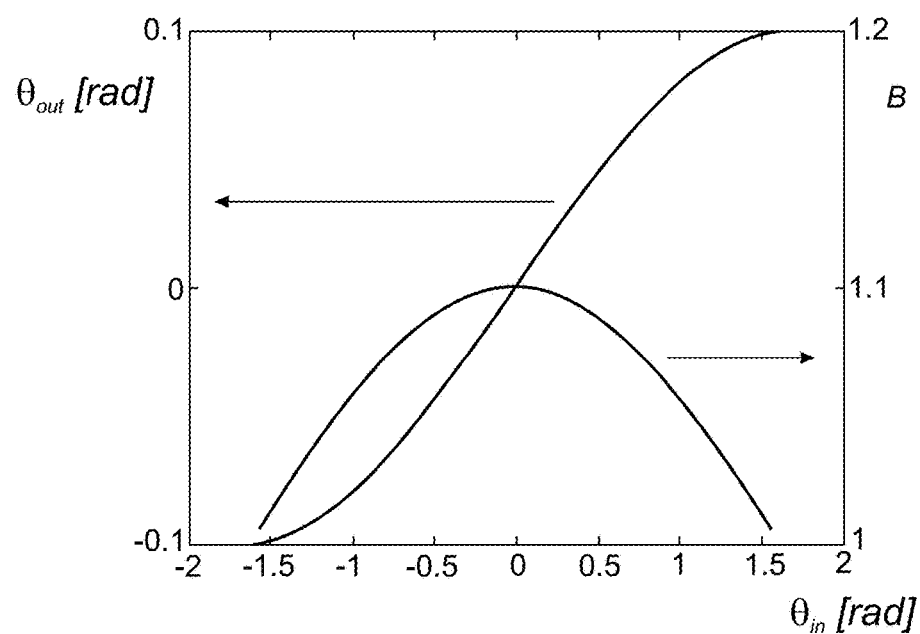
FIGS. 8A, 8B and 8C are graphs demonstrating that when a ratio between amplitudes is generally constant, a large change in the phase difference at the input translates to a smaller change of the phase difference at the output for various values of the division factor.
Figure 8B:
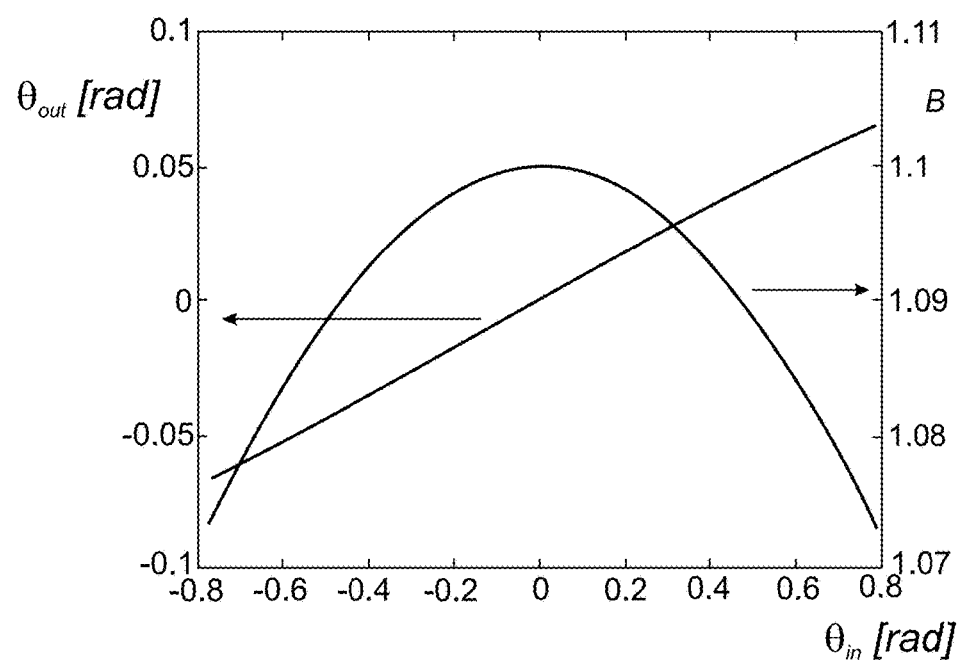
Figure 8C:
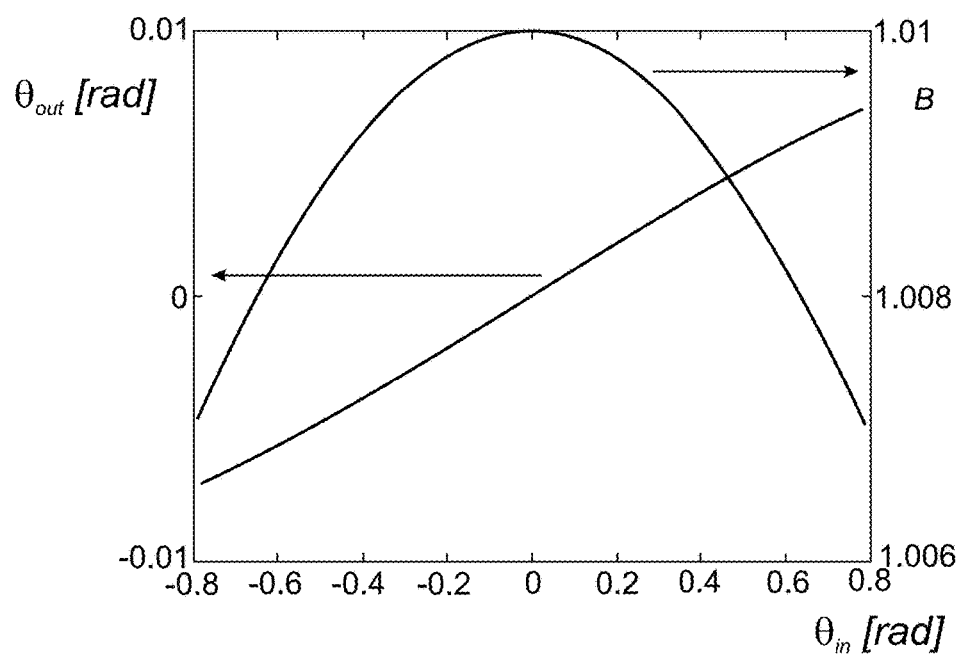

FIGS. 8A-C graphically show that using the embodiment described hereinabove in which the value of $\hat{A}$ is constant, a large change in $\theta_{in}$ translates to a smaller change in $\theta_{out}$, at various values of modulation phase shift dividing factor g. In FIG. 8A, $\hat{A}=1/10$ which means that g=10, and the input phase is in the range of −1.5 to 1.5 Rad. In FIG. 8B, $\hat{A}=1/10$ which means that g=10, and the input phase is in the range of −0.8 to 0.8 Rad. In FIG. 8C, $\hat{A}=1/100$ which means that g=100. As shows in the graphs of FIGS. 8A-C, the change in the phase of the output signal is within a certain range approximately linearly proportional to the change in the input phase divided by g, or, written mathematically, $\Delta\theta_{out} \propto \Delta\theta_{in}/g$ over an input phase range of at least 1 radian. In the region in which $\theta_{out}$ is linearly proportional to $\theta_{in}/g$, the amplitude B of the output signal varies by about 3%.

In some embodiments, the ratio $\hat{A}$ of the modulation amplitudes of the summed signals is varied in a controlled fashion. For example, the proper value of $\hat{A}$ can vary for different values of $\theta_{in}$. The present inventor observed that for $A_2=A_1=1$ in eq. (1.1), namely for a case in which the modulation amplitudes of the signals being summed are equal, the derivative of the eq. (1.3) is equal to:

$$\frac{d\theta_{out}}{d\theta_{in}} = 1/2 \tag{1.7}$$

Thus, in this case, the change in the output phase $\theta_{out}$ is equal to half the change in the input phase $\theta_{in}$. Therefore, the summation of two waves of equal amplitude corresponds to g=2. Based on this observation, performing this operation in N concatenate stages, namely by performing N summations, where at each stage the output of the previous stage is summed with a signal whose amplitude is set to be equal to that of the output of the previous stage and whose phase is constant, results in a final derivative $$\frac{d\theta_{out,N}}{d\theta_{in}} = (1/2)^N \tag{1.8}$$

where $\theta_{out,N}$ is the output phase after the $N^{th}$ stage. For example, for N=3, the output phase $\theta_{out}$ is equal to the input phase $\theta_{in}$ divided by 8, and for N=7 the output phase $\theta_{out}$ is equal to the input phase $\theta_{in}$ divided by 128. It is appreciated that a similar procedure can be employed for other values.

In some embodiments, in order to achieve the effective realization of N concatenate stages, the value of $\hat{A}$, for a given input phase $\theta_{in}$, is selected as follows:

$$\hat{A} = 1 + \sum_{k=2}^{N} a_k \tag{1.9}$$

where $$a_k \equiv (2 + 2\cos(\varphi_k))^{1/2} \tag{1.10}$$

and $\varphi_1 = \theta_{in}$, so that for k=2:

$$\phi_2 = \theta_1 + tn^{-1}\left(\frac{\sin(\theta_{in})}{1+\cos(\theta_{in})}\right) \tag{1.11}$$

for k=3:

$$\phi_3 = tn^{-1}\left(\frac{\sin(\phi_2)}{1+\cos(\phi_2)}\right) \tag{1.12}$$

and in general for k≥3

$$\phi_k = tn^{-1}\left(\frac{\sin(\phi_{k-1})}{1+\cos(\phi_{k-1})}\right) \tag{1.13}$$

Figure 9A:
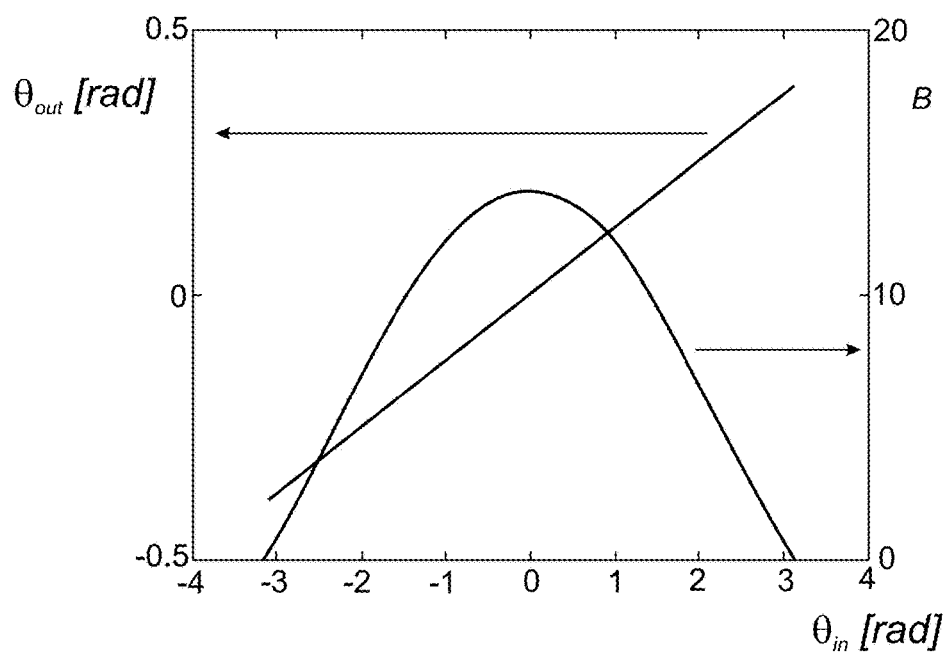
FIGS. 9A and 9B are graphs demonstrating that using a repetition scheme a large change in the phase difference at the input translates to a smaller change of the phase difference at the output.
Figure 9B:
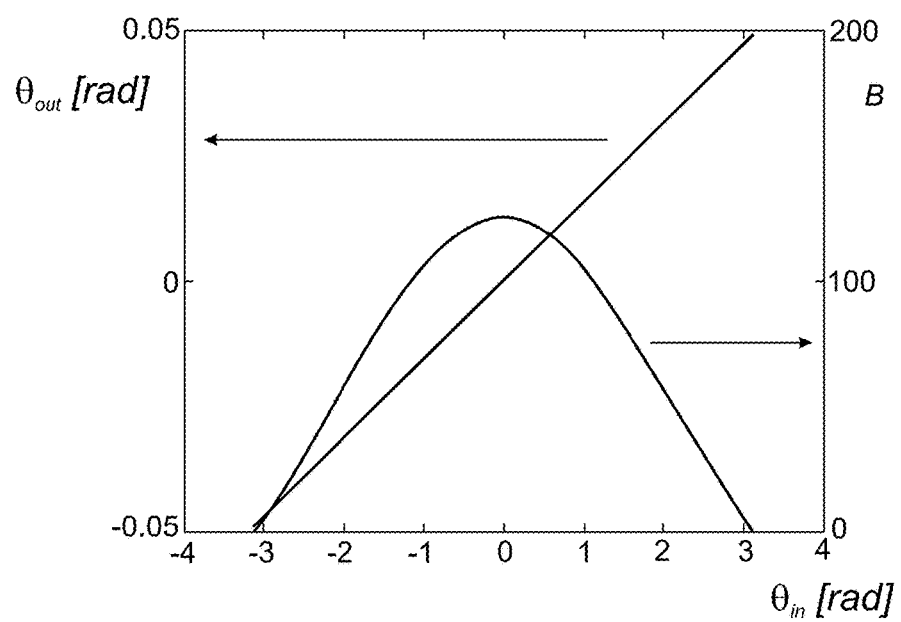

FIGS. 9A and 9B graphically show that using the embodiments described in EQs. (1.7)-(1.13) a large change in $\theta_{in}$ translates to a smaller change in $\theta_{out,N}$, at various stages N.

In FIG. 9A, N=3, and in FIG. 9B, N=6. Both graphs illustrate that the change in the output phase $\theta_{out,N}$ is $2^N$ smaller than the change in the input phase $\theta_{in}$. The graphs show that the amplitude B of the output signal varies as well, limiting the usable range of $\theta_{in}$ to approximately $\pi$ radians. It is to be understood that other choices of $\hat{A}$, for a given input phase $\theta_{in}$ are also possible and can result in $\Delta\theta_{out} \propto \Delta\theta_{in}/g$. This can be seen by evaluating from eq. (3) the derivative $d\theta_{out}/d\theta_{in}$ and determining under what conditions it has a value less than 1. For $\theta_{in}$ close to zero or $\pi$, $\hat{A}$ is preferably less than 1, and more preferably less than 0.1.

Figure 14:
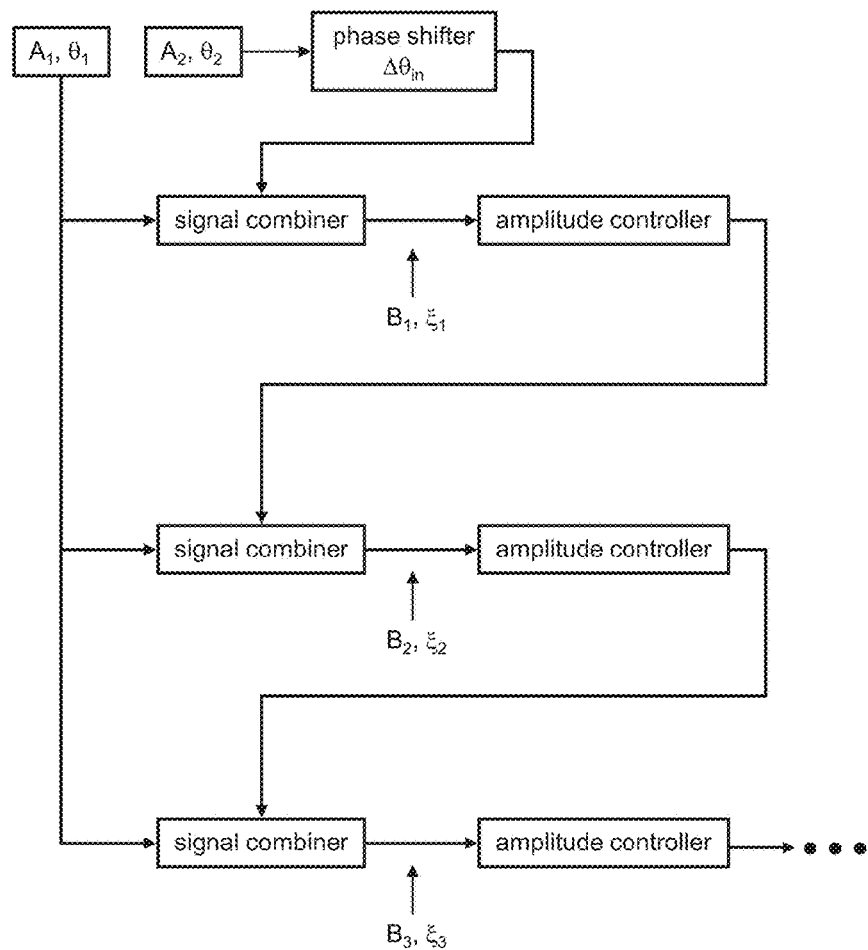
FIG. 14 is a schematic illustration of a signal concatenation process according to some embodiments of the present invention.

A concatenation process contemplated according to some embodiments of the present invention is illustrated in FIG. 14, where $B_k$, k=1, 2, . . . , n is the amplitude of the output signal at the kth level, and $\xi_K \approx \theta_1 + \Delta\theta_{in}/g^k$.

Also contemplated, are embodiments in which both $\hat{A}$ and $\theta_{in}$ are varied such that the derivative $d\theta_{out}/d\theta_{in}$ remains generally constant during the variation. From Equation 1.3 above, the derivative $d\theta_{out}/d\theta_{in}$ and the output amplitude B satisfy:

$$\frac{d\theta_{out}}{d\theta_{in}} = \frac{\hat{A}^2 + \hat{A}\cos(\theta_{in})}{1+2\hat{A}\cos(\theta_{in})+\hat{A}^2} \tag{1.14}$$

and $$B \approx \sqrt{1+2\hat{A}\cos(\theta_{in})+\hat{A}^2}. \tag{1.15}$$

For $\theta_{in}$ which is sufficiently small or sufficiently close to $\pi$ radians, and for sufficiently small values of $\hat{A}$, the derivative $d\theta_{out}/d\theta_{in}$ and output amplitude B can be approximated as:

$$\frac{d\theta_{out}}{d\theta_{in}} = \frac{\hat{A}\cos(\theta_{in})}{1+2\hat{A}\cos(\theta_{in})} \tag{1.16}$$

and $$B \approx \sqrt{1+2\hat{A}\cos(\theta_{in})}, \tag{1.17}$$

so that both $d\theta_{out}/d\theta_{in}$ and B depends $\theta_{in}$ through the expression $\hat{A}\cos(\theta_{in})$. Thus, according to some embodiments of the present invention both A and $\theta_{in}$ are dependently varied in a manner that maintains $\hat{A}\cos(\theta_{in})$ generally constant. Such dependent variation can ensure that the both the derivative $d\theta_{out}/d\theta_{in}$ and the output amplitude B remain generally constant.

The following procedure can therefore be employed for varying $\hat{A}$ and $\theta_{in}$.

1) Begin with a value of $\theta_{in}$ which is sufficiently small or sufficiently close to $\pi$ radians, and a value of $\hat{A}$ that is sufficiently smaller than 1, so that $\hat{A}\cos(\theta_{in})$ is sufficiently small.

2) Vary em by the amount of $\Delta\theta_{in}$ ($\theta_{in} \to \theta_{in}+\Delta\theta_{in}$) and also vary $\hat{A}$ by the amount of $\Delta\hat{A}$ ($\hat{A} \to \hat{A}+\Delta\hat{A}$), such that:

$$(\hat{A}+\Delta\hat{A})\cos(\theta_{in}+\Delta\theta_{in}) \approx \hat{A}\cos(\theta_{in}). \tag{1.18}$$

The above variation can be executed for example, by selecting the following variation to $\hat{A}$, for a given variation $\Delta\theta_{in}$:

$$\Delta \hat{A} = \frac{\hat{A} \cos(\theta_{in})}{\cos(\theta_{in} + \Delta \theta_{in})} - \hat{A} \quad (1.19)$$

Such a procedure can ensure that the derivative $d\theta_{out}/d\theta_{in}$, hence also B, remains generally constant over a sufficiently wide region. The change of $\theta_{out}$ is given by $(d\theta_{out}/d\theta_{in})\Delta\theta_{in}$.

It is appreciated that the user can control the value of g hence also the resolution of the phase shift of the output signal. For example, for $\Delta\theta_{in}=1°$, the resolution of the output phase change $\Delta\theta_{out} \propto \Delta\theta_{in}/g$ can be on the order of 0.10° or 0.010° or 0.001° or even less.

Figure 10:
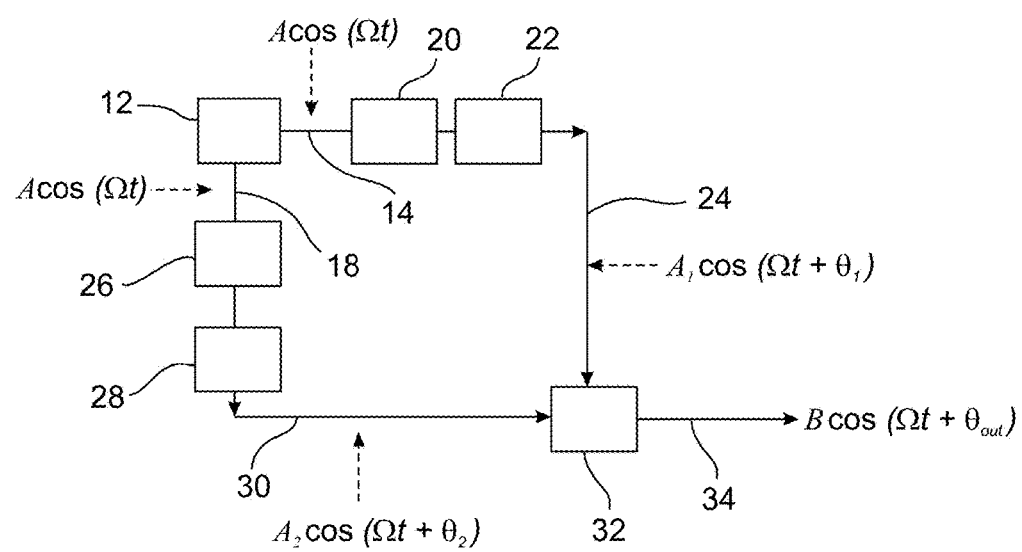
FIG. 10 is a schematic illustration of a system for controlling the phase shift of a modulated signal, according to some embodiments of the present invention.

FIG. 10 is a schematic representation of an embodiment of a system 10 for controlling the phase shift of a modulated signal.

System 10 includes a signal generator 12, for generating a modulated signal $S_{source}$, having a first portion defining a first modulated signal 14 and a second portion defining a second modulated signal 18.

In some embodiments, not illustrated in FIG. 10, system 10 includes a first signal generator for generating a first modulated signal 14 and a second signal generator for generating a second modulated signal 18.

In some embodiments, first modulated signal 14 is received from another signal source (not shown) and signal generator 12 is used to generate second modulated signal 18.

First modulated signal 14 is directed to one or more signal manipulators, including first amplitude controller 20 configured to adjust, or control, the modulation amplitude of signal 14, and a first phase controller 22, configured to adjust, or control, the modulation phase of signal 14. Following operation of first amplitude controller 20 and first phase controller 22, is a processed signal 24, is given by the formula $A_1 \cos(\Omega t+\theta_1)$.

Second modulated signal 18 is directed to one or more signal manipulators, including second amplitude controller 26 configured to adjust, or control, the modulation amplitude of signal 18, and a second phase controller 28, configured to adjust, or control, the modulation phase of signal 18. The signal output from second amplitude controller 26 and second phase controller 28, is a controlling signal 30, given by the formula $A_2 \cos(\Omega t+\theta_2)$. The difference between the modulations phases of signal 14 and signal 18 is given by the formula $\theta_{in}=\theta_1-\theta_2$.

In some embodiments amplitude controllers 20 and 26 are configured to set the ratio of the modulation amplitude of the controlling signal 30 and the processed signal 24, given by the formula $\hat{A}=A_2/A_1$ to a fixed value smaller than 1, which fixed value is controlled by the operator, while in other embodiments amplitude controllers 20 and 26 are configured to change the ratio of the modulation amplitude of the controlling signal 30 and the processed signal 24, given by the formula $\hat{A}=A_2/A_1$ together with changes to $\theta_{in}$.

In some embodiments, the values of $\theta_{in}$ and $\hat{A}$ are set by controlling the modulation phase and modulation amplitude of only one of first and second modulated signals 14 and 18. Thus, in some embodiments in which the user controlled values of $\theta_{in}$ and $\hat{A}$ are set only by manipulating first modulated signal 14, amplitude controller 26 and phase controller 28 may be obviated. In other embodiments in which the user controlled values of $\theta_{in}$ and $\hat{A}$ are set only by manipulating second modulated signal 18, amplitude controller 20 and phase controller 22 may be obviated.

Signal manipulators 20, 22, 26, and/or 28 may include any suitable signal manipulator, and may comprise a suitable amplifier known in the art.

Processed signal 24 and controlling signal 30 are provided as input to an output signal generator 32, which generates an output signal 34, denoted $S_{out}$, and given by the formula B $\cos(\Omega t+\theta_{out})$. Due to the characteristics of processed signal 24 and controlling signal 30, the change in the modulation phase $\theta_{out}$ of output signal 34 (denoted $\Delta\theta_{out}$) is proportional to variations made by the operator to $\theta_{in}=\theta_2-\theta_1$ (denoted $\Delta\theta_{in}$), and is smaller than such variations to $\Delta\theta_{in}$ by a modulation phase shift dividing factor (denoted g), or, stated mathematically, $\Delta\theta_{out} \propto \Delta\theta_{in}/g$. As explained hereinabove, g is greater than 1, and in some embodiments is set by the operator to be sufficiently large, such that large changes in the phase difference $\theta_{in}$ of the signals input to output signal generator 32 is translated by output signal generator 32 to small changes in the phase of the output signal 34.

Example 2

Phase Amplification

Referring to Eq. (1.1) above, when the two signals being summed have a phase shift of $\pi$ or nearly $\pi$ (the signals are substantially mutually in anti-phase), and in addition the modulation amplitudes of the summed signals are exactly or nearly equal to one another, then it can be calculated that:

$$\theta_{out}-\theta_1=tn^{-1}[\in/(\alpha+\in^2/2)] \quad (2.1)$$

where $\in=|\theta_{in}-\pi|$ and $\alpha=|\hat{A}-1|$.

When the two signals have a phase difference $\theta_{in}$ close to 0, and they are subtracted from one another instead of being summed:

$$\theta_{out}-\theta_1=tn^{-1}[\theta_{in}/(\alpha+\theta_{in}^2/2)] \quad (2.2)$$

A small change $\Delta P$ in a physical parameter P of an object interacting with a signal affects a small change in the modulation phase $\theta_1$ of that signal, which phase change can be as characterized by the derivative $d\theta_1/dP$. As a result, a change defined by $d\theta_{out}/dP=(d\theta_{out}/d\theta_1)\cdot(d\theta_1/dP)$ is larger than the change in the modulation phase by a modulation phase shift amplification factor G, defined as $G=d\theta_{out}/d\theta_1$.

By applying derivation rules to EQs. (2.1) and (2.2), the sensitivity of the modulation phase of the output signal to changes in $\theta_{in}$ when $\theta_{in}$ is close to 0 is $\alpha/(\alpha^2+\theta_{in}^2)$, which is maximal when $\theta_{in}=0$, and the sensitivity of the modulation phase of the output signal to changes in $\varepsilon$, when $\theta_{in}$ is close to $\pi$, is $\alpha/(\alpha^2+\in^2)$, which is maximal when $\in=0$. The sensitivities are inversely proportional to $\alpha$. In cases in which $\theta_2$ is constant, a maximal value of the modulation phase shift amplification factor is achieved, which maximal value amplification is given by:

$$G_{MAX}=1/\alpha \quad (7)$$

The output signal modulation amplitude B, which when $\alpha \ll 1$, and when $\in=0$ or $\theta_{in}=0$ is approximately equal to $\alpha$, and provides a lower bound on suitable values of $\alpha$. For example, for $\alpha=0.01$, $G_{MAX}=100$ and the output signal modulation amplitude B is reduced by two orders of magnitude in the region of maximum sensitivity.

The sensitivity and G are within 50% of the maximal sensitivity as long as $|\in|<\alpha$ when $\theta_{in}$ is close to $\pi$, and $\theta_{in}<\alpha$, when $\theta_{in}$ is close to 0.

Figure 11A:
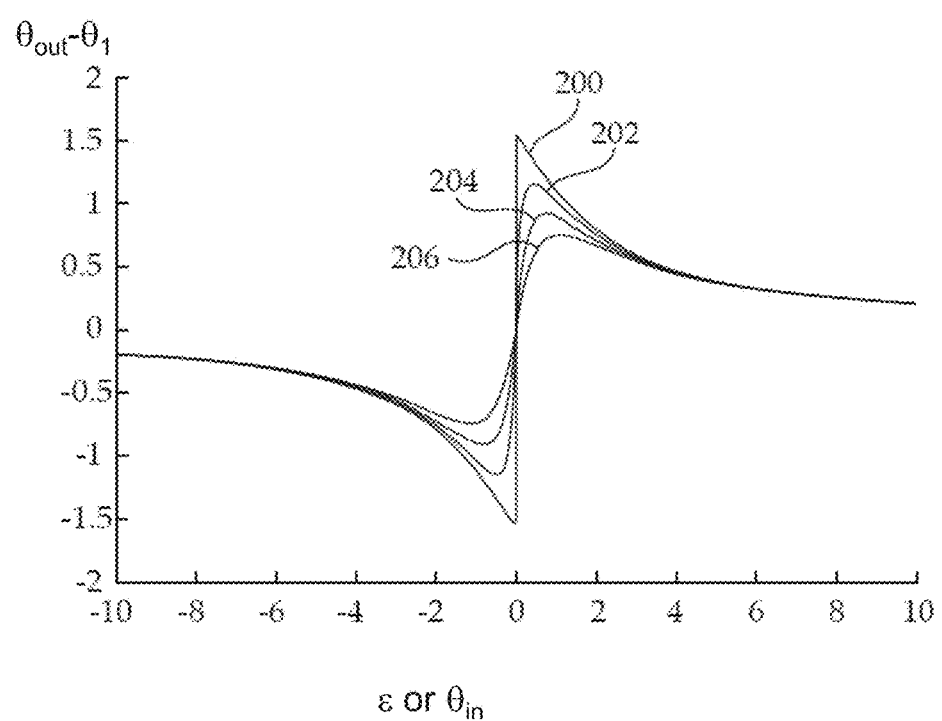
FIGS. 11A and 11B are graphs showing phase shift values as a function of the deviation of the input phase shift from 0 or π.

FIG. 11A displays a graph showing values of $\theta_{out}-\theta_1$ as a function of the value of $\varepsilon$ (when $\theta_{in}$ is close to $\pi$) or $\theta_{in}$ (when $\theta_{in}$ is close to 0). As shown, the maximum slope (sensitivity) corresponds to the region of small $\theta_{in}$ or $\varepsilon$ values. Specifically, from plot 200 is seen that when $\alpha=0.001$, the region of high sensitivity is in the range of $-0.001<\in, \theta_{in}<0.001$.

Figure 11B:
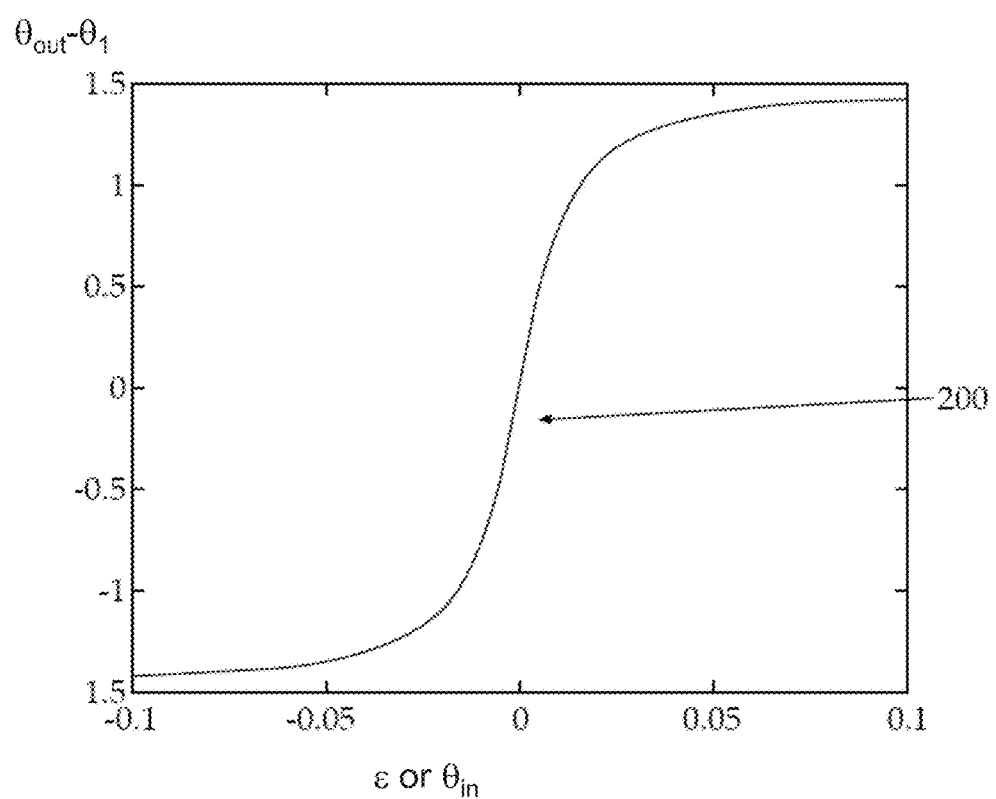

From plot 202 is seen that when α=0.101, the region of high sensitivity is in the range of $-0.101 < \epsilon, \theta_{in} < 0.101$. From plot 204 is seen that when α=0.201, the region of high sensitivity is in the range of $-0.201 < \epsilon, \theta_{in} < 0.201$. From plot 206 is seen that when α=0.401, the region of high sensitivity is in the range of $-0.401 < \epsilon, \theta_{in} < 0.401$. It is therefore concluded that when $\theta_{in}$ is close to π the region for ε which has high sensitivity is given by the formula $|\epsilon| < \alpha$, and when $\theta_{in}$ is close to 0 the region for $\theta_{in}$ which has high sensitivity is given by the formula $|\theta_{in}| < \alpha$. FIG. 11B displays plot 200 of FIG. 11A, over a smaller region around the value of small ε or $\theta_{in}$, to more clearly show the exact region of high sensitivity.

Figure 12:
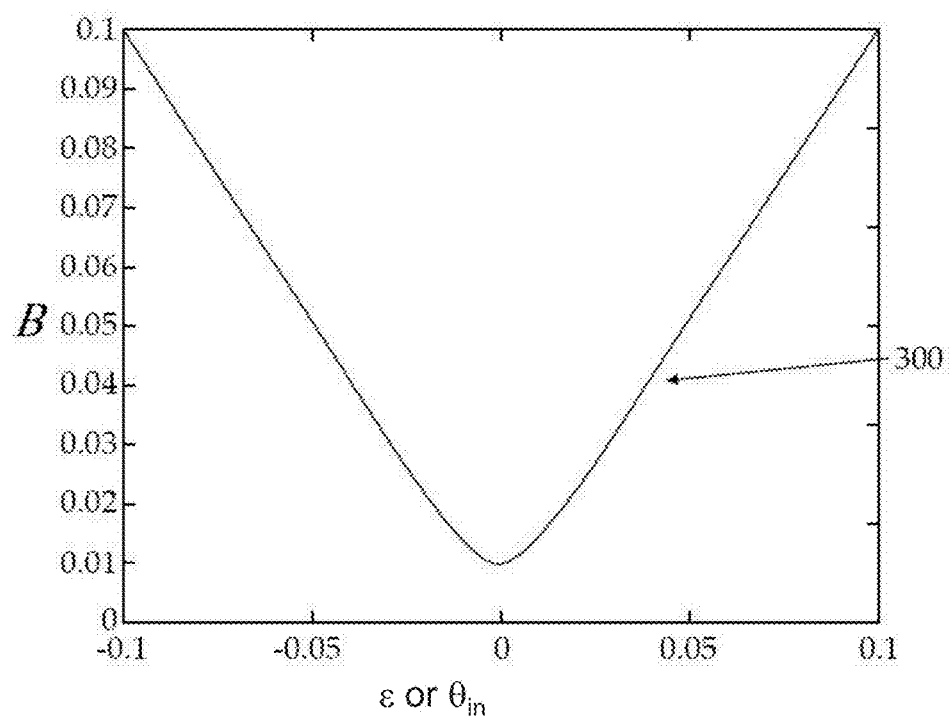
FIG. 12 is a graph of the dependence of a modulation amplitude at the output signal on the deviation of the input phase shift from 0 or π.

FIG. 12 displays a graph 300 of the dependence of the modulation amplitude B of the output signal on the value of ε (for $\theta_{in}$ close to π) or $\theta_{in}$ (for $\theta_{in}$ close to 0) for α=0.01, showing the reduction in amplitude by a factor equal to α=0.01 in the region of high sensitivity.

Figure 13:
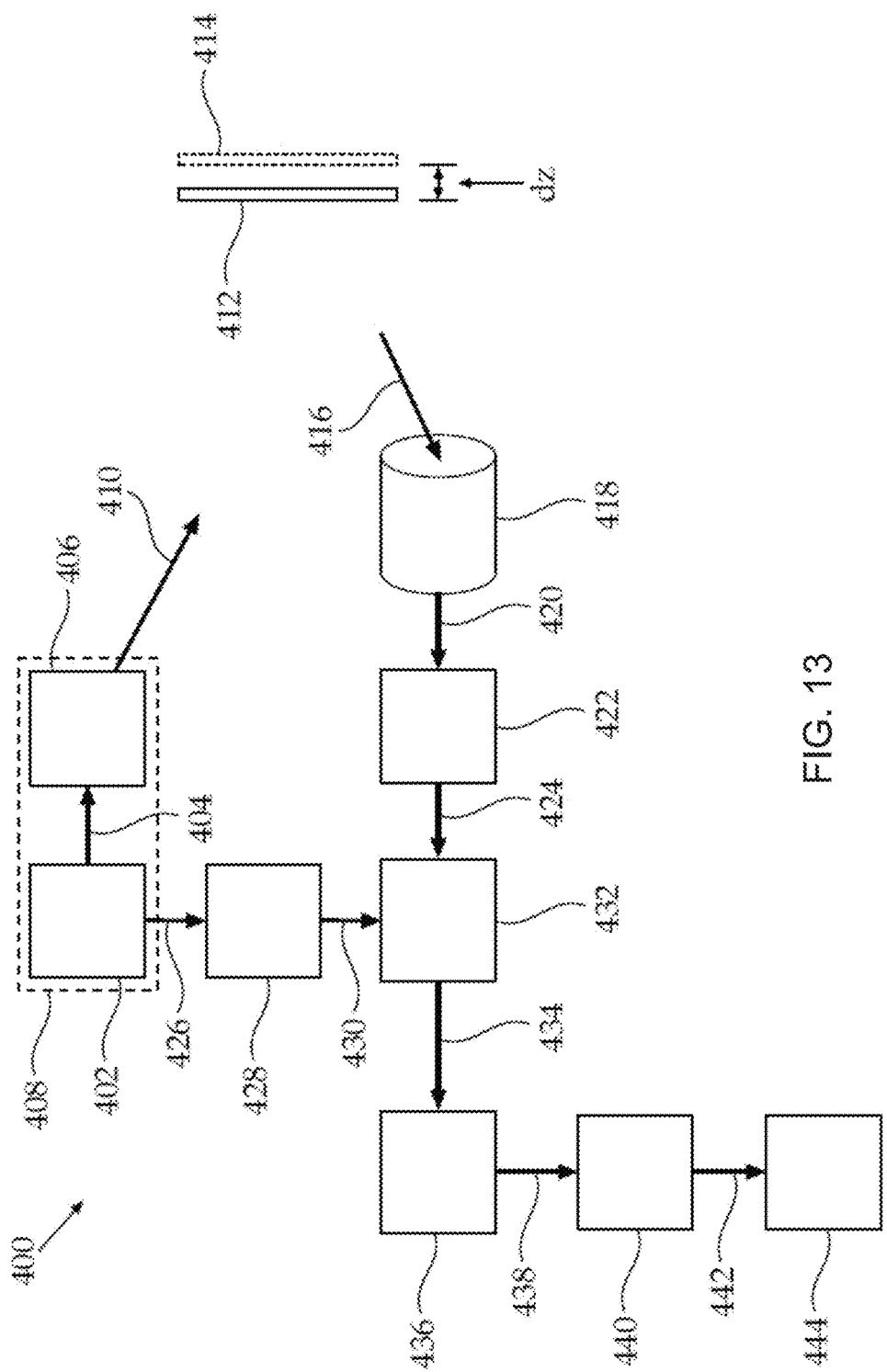
FIG. 13 is a schematic illustration of a system for sensing the displacement of an object, according to some embodiments of the present invention.

FIG. 13 is a schematic representation of an embodiment of a system 400 for sensing the displacement of an object and for three dimensional imaging of an object using a method for quantifying a modulation phase shift of a modulated signal subsequent to interaction with the object according to an embodiment of the teachings herein.

System 400 comprises a waveform generator 402 which generates a sinusoidal modulated signal 404 which modulates a light source 406. The light source may provide illumination at any suitable wavelength range, as further detailed hereinabove.

Waveform generator 402 and light source 406 together define a signal generator 408 which emits a modulated light signal 410. The modulated light signal 410 is directed towards, and illuminates an object 412 located at a distance z0 from the light source 406. Subsequently, the distance traversed by the light signal 410 from light source 406 to object 412 is changed by a distance dz. In some embodiments this occurs when illuminated object 412 changes its position by a distance dz, such that it is at a distance z0+dz from the light source 406. The new position of the object 412 is indicated by reference numeral 414. In other embodiments, this occurs when the modulated light signal 410 is directed at another point on object 412, which point is at a different distance from the light source 406.

At least some of the modulated light signal 410 which impinges on object 412 is reflected as a reflected signal 416, and at least a portion of the reflected signal 416 is collected by a light detector 418. Due to the movement of object 412 to position 414, the modulation phase of light signal 416 varies linearly with the change dz in location of the object 412 by an amount proportional to 2Kdz, where K=Ω/c=2π$f_m$/c. This is due to the fact that the distance between the light source 406 and the object 412 has increased by dz, and thus the total propagation distance of light signal 410 from light source 406 to object 412 and light signal 416 from the object 412 to the detector 418 has increased by a distance of 2dz. Consequently, the time of flight of modulated light signal 410 from light source 406 to object 412, and the time of flight of reflected signal 416 from object 412 to the detector increases proportionately to the increase in distance.

Light detector 418 provides as an output a received signal 420, which is a modulated (sinusoidal) signal. Received signal 420 has a modulation phase which corresponds to the modulation phase of light signal 416 reflected from object 412, and a modulation amplitude that is dependent upon several parameters, among them the alternating current (AC) power of the modulated light signal 410 and the reflection of the object 412 at its original location or at location 414.

In some embodiments signal 420 is provided as an input to amplitude locker 422, which is configured to lock the modulation amplitude of signal 420 and, such that a sinusoidal modulated signal 424 provided as the output of amplitude locker 422 has a set modulation amplitude value, controlled by an operator of the system 400, and a modulation phase that corresponds to the modulation phase of signals 420 and 416. In some embodiments, the modulation amplitude of signal 424 is independent of the modulation amplitude of signal 420 provided as input to amplitude locker 422. As such, signal 424 has a constant modulation amplitude (which value is determined and set by the operator), and a modulation phase including a constant component (whose value is determined and set by the operator) and a component that changes proportionally with 2Kdz.

It is appreciated that setting of the modulation amplitude and/or of the constant component of the modulation phase can be accomplished by various electric circuits, for example in combination with an amplifier, as known in the art.

Concurrently with directing of a signal 410 towards object 412 and receipt and processing of received signal 416, waveform generator 402 generates another modulated signal 426, and provides the modulated signal 426 to at least one signal manipulator 428. Signal manipulator 428 provides as output a reference signal 430.

One or more signal manipulator 428 is configured to set the modulation amplitude and modulation phase of signal 426 to generate reference signal 430 as output. The modulation amplitude of reference signal 430 is set to be substantially equal to the modulation phase of signal 424, such that a ratio of the modulation amplitude of the reference signal 430 and the modulation amplitude of signal 424 is close to 1.

In some embodiments, the modulation phase of reference signal 430 is set to be offset from the modulation phase of signal 424 by an amount close to π radians (for an illuminated object at a distance of z0 from the illuminating light source).

In some embodiments, reference signal 430 is set to be substantially in phase with signal 424, i.e., the modulation phase of reference signal 430 is set to be offset from the modulation phase of signal 424 by an amount close to 0 (for an illuminated object at a distance of z0 from the illuminating light source). Signal 424 and reference signal 430 are provided to an output signal provider 432, which provides as output a modulated output signal 434.

In embodiments in which the modulation phase of reference signal 430 is set to be offset from the modulation phase of signal 424 by an amount close to π radians, output signal provider 432 comprises a component, such as a signal-adder, configured to provide an output signal including the sum of AC portions of the signal 424 and of reference signal 430, or to provide an output signal having an AC component which is proportional to the sum of the AC components of signal 424 and of reference signal 430 at a modulation frequency of Ω. In embodiments in which the modulation phase of reference signal 430 is set to be offset from the modulation phase of signal 424 by an amount close to 0, output signal provider 432 comprises a component, such as a signal subtractor, configured to provide an output signal including the difference between signal 424 and reference signal 430, or to provide an output signal having an AC component which is proportional to the difference of the AC components of signal 424 and of reference signal 430 at a modulation frequency of Ω.

The modulated output signal 434 has an output signal modulation amplitude of B and an output signal modulation phase, which output signal modulation phase changes with displacement of magnitude dz of object 412. Due to the modulation phase amplification factor of signal 424, the output signal modulation phase of modulated output signal 434 is amplified.

Modulated output signal 434 is provided as an input to a modulation phase measurer 436. Modulation phase measurer 436 identifies and quantifies the values of the output signal modulation phase and/or of changes to the output signal modulation phase, and provides as output an output signal modulation measure signal 438, representing the output signal modulation phase and/or phase changes thereto.

In some embodiments, modulated output signal 434 may be provided as an input to a modulation amplitude measurer (not shown) in addition to, or instead of, being provided to modulation phase measurer 436. The modulation amplitude measurer identifies and quantifies the values of the output signal modulation amplitude B and/or of changes to the output signal modulation amplitude AB, and provides as output an output signal modulation measure signal 438 representing the output signal modulation phase B and/or changes ΔB thereto.

Output signal modulation measure signal 438 is provided as an input to an electronic calculation system 440. Electronic calculation system 440 computes the value of dz using known values of G and K based on the formula $dz=\Delta(\theta_{out}-\theta_1)/(G2K)$. Where $\Delta(\theta_{out}-\theta_1)$ is the measured phase change. The value of dz computed by electronic calculation system 440, and in some embodiments also a measure of the distance z0 at which object 412 was displaced, is output from electronic calculation system 440 as a parameter change signal 442. The parameter change signal 442 is provided to the operator via a user interface 444, such as a memory, display, speaker, or transmitting system.

Given the discussion hereinabove, it is appreciated that for a modulation phase measurer 436 having a minimum resolvable modulation phase change $\Delta\xi_{min}$, the minimum resolvable change in displacement is $dz_{min}=\Delta\xi_{min}/(G2K)$.

There is a maximum resolvable depth window in the range $z0\pm\Delta z_{max}$, where $\Delta z_{max}=\alpha/2K$. The number of resolvable depth points is $N\equiv\Delta z_{max}/dz_{min}=1/(2\Delta\xi_{min})$.

For example, considering a situation in which the value of α is set to be 0.04 such that the values of G and $\Delta\xi_{min}$ are given by $G=1/\alpha=25$ and $\Delta\xi_{min}=20$ mRad, and the modulation frequency is set at $f_m=2$ MHz, the depth resolution is approximately 1 cm and the size of the maximal depth window is given by $2\Delta z_{max}$ 50 cm, with 25 resolution points.

It is appreciated that some embodiments of the method and systems of the teachings herein allow one to obtain sub-micron depth resolution. For example, if $f_m=20$ GHz and α is set to be 0.01 so that G=100, the depth resolution is reduced to 0.25 microns, or, in other words, to sub-micron depth resolution. As will be clear to a person of ordinary skill in the art, there are many applications in high-precision manufacturing and metrology which require such resolution.

It is further appreciated that some embodiments of the methods and the systems of the teachings herein do not impose a coherence requirement on the frequency or phase characteristics of the electromagnetic radiation which is acting as the carrier for the modulated signal. Therefore, some embodiments of the teachings herein are advantageous over other high-resolution techniques known in the art, which do impose such a coherency requirement.

The main elements of the embodiment of FIG. 13 described hereinabove can be implemented for two-dimensional (2D) or three-dimensional (3D) imaging, such as for topography mapping, computer gaming, radar and other applications.

In some such embodiments, various technological elements and method may be used, such as using an array of detectors such as CMOS-based arrays or other types of detector arrays together with imaging optics to image n×m volume pixels (voxels) in parallel, while changing the direction of the illumination beam in two-dimensions (e.g., elevation and azimuth) to "scan" a region.

Example 3

Photonic RF Phase-Shift Amplification by RF Interferometry

This Example presents a technique for RF phase-shift amplification based on RF interferometry and demonstrates it in an optical system. This Example shows that the input phase noise is not amplified together with the input phase signal, so that the phase sensitivity improves with higher phase-shift amplification. This Example predicts that in the case of correlated amplitude noise, the sensitivity is not affected by amplitude noise. With 600 MHz modulated light and a phase amplification of 100, a phase-shift resolution of 0.2 mrad is demonstrated, giving 8 μm distance resolution. It is envisioned that nanometric distance resolution can be achieved, for example, with sub-GHz modulation.

Many applications in RF radar and sensing, including RF photonic applications, require the sensitive detection or manipulation of the RF phase shift [1-9]. For example, displacement and velocity sensing, such as phase-shift radar, are two important applications which would benefit from low-noise high-resolution RF phase-shift detection. For other applications in microwave system design as well as dielectric material characterization, vector network analysis of the RF magnitude and phase spectrum is desired. However, the phase-shift sensitivity of conventional applications are limited by the capabilities of conventional RF phase detectors to a minimum value of approximately 1 degree, due to nonlinear effects as well as noise. Various methods that fall into the general category of RF interferometry have been developed for detecting phase shifts with improved accuracy for a given SNR, based on either multiplication or summation of a signal and reference. For example, a digital quadrature mixer using a quadrature sampling signal processing technique has been proposed in [2]. Another approach is to amplify the phase-shift by placing N frequency dividers between a voltage controlled oscillator (VCO) and the phase detector, so that the output of the VCO is multiplied up in frequency and phase by the factor N [11]. It was found by the present inventor that this is accompanied by an increase of the effective phase noise power of the VCO by the same factor N, so that the overall phase-change sensitivity is not improved.

This Example describes a phase-shift amplifier that is based on destructive interference between two sinusoidal signals. This amplifier is particularly useful for "boosting" small phase shifts before applying phase detection. It is show below that this phase-shift amplification technique does not amplify the input phase noise, which is the dominant noise in these systems. Therefore, as opposed to conventional amplifiers, the phase-shift sensitivity improves with the phase-shift gain of the amplifier. Another attractive feature of this amplifier is the fact that it preferably does not amplify amplitude noise as well if this noise fulfills a correlation condition that will be described below. Due to these features, 0.2 mrad phase-shift (i.e., approximately 0.01 degree) resolution is demonstrated with a phase-shift amplification of 100, leading to 8 micron resolution in a displacement sensing application. Nanometric resolution is predicted as well with sub-GHz modulation frequencies.

Using the notations in Example 1 above, when, for example, $\theta_{in} = \pi + \in$, where $\in \ll 1$, an approximately linearly dependence of $\theta_{out}$ upon the phase-shift $\in$ with slope G is achieved:

$$\theta_{out} \approx \theta_1 + G \in \quad (3.1)$$

where $G = (1 - \hat{A})^{-1}$ is the phase-shift amplification factor near $\in = 0$. In this region, as the ratio $\hat{A} = A_2/A_1$ approaches 1, G increases and the output amplitude B decreases by a factor $G^{-1}$ due to destructive interference.

Figure 15:
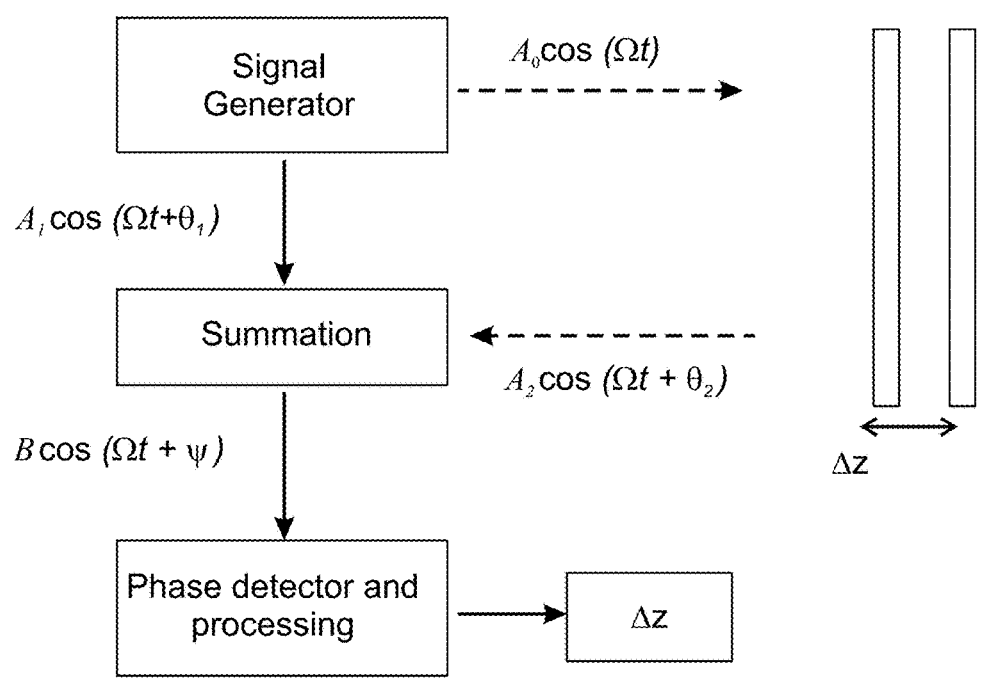
FIG. 15 is a schematic illustration of RF phase amplification according to some embodiments of the present invention.

A basic block diagram of a system based on this technique for amplifying small phase shifts, taking as an example the measurement of a small displacement $\Delta z$, is illustrated in FIG. 15. An RF signal $A_0 \cos \Omega t$ irradiates a target and returns as $A_0 \cos(\Omega t + \theta_2)$, where it is summed with a reference signal $A_0 \cos(\Omega t - \theta_1)$ to form $B \cos(\Omega t + \psi)$. Thus, in this example, the output phase $\theta_{out}$ is enacted by $\psi$.

The system is optionally and preferably initially biased so that $\theta_{in} = \pi$ and the amplitude ratio $\hat{A}$ is set to give the desired phase amplification G. A subsequent small displacement $\Delta z$ of the object leads to $\theta in = \pi + \Delta \in$ where $\Delta \in 2Kn\Delta z$ is the additional round-trip phase-change, $K = 2\Omega/c$ being the modulation wavenumber and n being the refractive index of the medium at which the signal propagates. For example, for $f = \Omega/2\pi = 10^9$ Hz, a displacement of 4 μm in free space gives about 0.01 degrees of RF phase shift, which is difficult to measure. After phase amplification, the phase shift is $\Delta \psi = G\Delta \in$, so that, for example, when $G = 100$ the phase shift is be about 1 degree which is measurable.

The two dashed arrows in FIG. 15 symbolize an RF signal which may be modulated on an optical carrier, other electromagnetic radiation, or alternatively a purely electronic signal. In addition, the measuring path may be free space or some other medium. As an example, an application in distance measurement is shown. However the measurement of any parameter which affects the RF phase (e.g., characterization of microwave systems or dielectric materials) is also contemplated.

Since $\psi \approx \theta_1 + G \in$ the output phase fluctuates due to two types of noise sources. A first type of noise source includes input phase noise on $\theta_1$ and $\varepsilon$, and a second type of noise source includes noise fluctuations of G which are due to amplitude noise on $A_1$ and $A_2$. The contributions of these types of noise sources to the output phase noise will now be evaluated. Without loss of generality, it is assumes that $$A_i = A_i^0 [1 + n_i(t)] \quad (EQ. 3.2a)$$

$$\Theta_i = \Theta_i^0 + \vartheta_i(t) \quad (EQ. 3.2b)$$

describe the sum of the average value and noise fluctuations of the amplitudes and phases respectively for the signal (i=1, 2). Inserting EQ. 3.2a into the definition of G leads to an amplification which fluctuates around an average value as $G = G^0 + g(t)$, where $$G^0 = \left(1 - \frac{A_2^0}{A_1^0}\right)^{-1}, \quad (EQ. 3.3a)$$

$$g(t) \approx G^{0^2}(n_2(t) - n_1(t)), \quad (EQ. 3.3b)$$

assuming weak amplitude noise $n_i(t) \ll 1$, and sufficiently high $G^0$ such that $A_1^0 \approx A_2^0$.

The input phase noise will now be evaluated.

From EQ. (3.2b), $\in = \Theta_2^0 - \Theta_1^0 - \pi + \in(t) + \Delta\in_{sig}$ where a small phase change $\Delta\in_{sig}$ to be amplified was incorporated into $\theta_{in}$, and where $\in(t)$, defined as $\in(t) = \vartheta_2(t) - \vartheta_1(t)$, is the phase-noise that accompanies $\Delta\in_{sig}$. Assuming without loss of generality an initial bias $\Theta_2^0 - \Theta_1^0 = \pi$ (the point of maximum sensitivity) gives $$\in = \Delta\in_{sig} + \in(t) \quad (EQ. 3.4)$$

so that the output phase $\psi$ is:

$$\psi = \psi^0 + \Delta\psi_{sig} + \psi(t), \quad (EQ. 3.5)$$

where without loss of generality $\psi^0 = \Theta_1^0$ can be taken to be zero, $$\Delta\psi_{sig} = G^0 \Delta\in_{sig} \quad (EQ. 3.6)$$

is the desired amplified phase-change signal within the linear region and $\psi(t)$ is the output phase noise. $\psi(t)$ can be written as:

$$\psi(t) = \psi_{phase}(t) + \psi_{amp}(t) + \psi_{mixed}(t) \quad (EQ. 3.7)$$

where $\psi_{phase}(t) = G^0 \in(t) + \vartheta_1(t)$ is a contribution to the output phase noise due to input phase noise, $\psi_{amp}(t) = g(t)\Delta\in_{sig}$ the output phase noise due to input amplitude noise which is statistically independent of $\psi_{phase}(t)$, and $\psi_{mixed}(T) = g(t)\in(t)$ is a mixed-noise contribution which is negligible for weak noise.

In the present example, Gaussian noise statistics was employed, but the spectral power of the input phase noise is typically sharply centered around the RF carrier. According to Leeson's well-known model of the phase-noise of RF oscillators, the effective phase-noise bandwidth is less than 10 Hz [12]. On the other hand, the amplitude noise is typically broader in bandwidth and more amicable to filtering. As is shown below, in certain cases the input amplitude noise does not degrade performance at all.

The minimum detectable phase-change in the presence of noise is denoted $\Delta\in_{sig,min}$. An SNR of unity is achieved when the output phase-change signal is equal to the RMS deviation of the output phase-noise. This is expressed as $$\Delta\psi_{sig,min} = G^0 \Delta\in_{sig,min} = \sigma_\psi, \quad (EQ. 3.8)$$

where $\sigma_\psi$ is the RMS deviation of $\psi(t)$, composed of two independent noise sources:

$$\sigma_\psi = \sqrt{\sigma_{\psi,phase}^2 + \sigma_{\psi,amp}^2} \quad (EQ. 3.9)$$

where $\sigma_{\psi,phase}^2$ is the variance of $\psi_{phase}(t)$, and $\sigma_{\psi,amp}^2$ is the variance of $\psi_{amp}(t)$.

$\psi_{phase}(t) = G^0 \in(t) + \vartheta_1(t) = G^0 (\vartheta_2(t) - \vartheta_1(t)) + \vartheta_1(t)$ is due to the input phase noise, and it is assumed that the phase-noise of the signal generator $\vartheta_{source}(t)$ is the dominant source of phase-noise in the system, so that $\psi_{phase}(t) = G^0 (\vartheta_{source}(t - \tau_{path}) - \vartheta_{source}(t)) + \vartheta_{source}(t)$. This reflects the fact that the measurement with signal 2 only adds a relative delay $\tau_{path}$ to the source phase noise, and any additional phase noise due to the transmission medium or object is negligible.

The correlation time of the source's phase noise will now be discussed. Since the effective phase noise bandwidth in any generator is less than 10 Hz, the correlation time $\tau_{corr} \leq 16$ ms, so that the phase noise on the two signals de-correlates only after an enormous path length difference of approximately $10^6$ m. Since $\tau_{path} \ll \tau_{corr}$, it can be assumed that $\vartheta_{source}(t-\tau_{path}) \cong \vartheta_{source}(T)$ and therefore $\psi_{phase}(t) = \vartheta_{source}(t)$ In other words, due to the fact that one signal is subtracted from the other, where both signals share common phase noise, the phase noise at the output is not amplified by $G^0$. Under these conditions Eqs. 3.8 and 3.9 give $$G^0 \Delta \in_{sig,min} = \sqrt{\sigma_\vartheta^2 + (\Delta \in_{sig,min})^2 \sigma_G^2} \quad \text{(EQ. 3.10)}$$

where $\sigma_\vartheta^2$ is the variance of $\vartheta_{source}(t)$ and $\sigma_G^2$ is the variance of g(t). Assuming that $n_1(t)$ and $n_2(t)$ are mutually uncorrelated but their respective RMS deviations $\sigma_{ni}$ are equal, i.e., $\sigma_{n1} \approx \sigma_{n2} = \sigma_n$, one obtains $\sigma_G \cong \sqrt{2} G^0 \sigma_n$. This leads to a sensitivity (defined at SNR=1) of:

$$\Delta \varepsilon_{sig,min}(\sigma_G \neq 0) \cong \frac{\sigma_\vartheta}{G^0}[1 + (G^0 \sigma_n)^2]. \quad \text{(EQ. 3.11)}$$

In various exemplary embodiments of the invention the expression $G^0 \sigma_n$ is selected sufficiently smaller than 1, as further detailed hereinabove.

When the amplitude noise is correlated, i.e., $n_2(t) \approx n_1(t)$ then g(t)=0 and $\sigma_G=0$, resulting in:

$$\Delta \varepsilon_{sig,min}(\sigma_G = 0) = \frac{\sigma_\vartheta}{G^0} \quad \text{(EQ. 3.12)}$$

EQs. 3.11 and 3.12 predict that the amplifier's phase-change sensitivity degrades in proportion to the phase-noise of the source and improves for higher values of the phase-change amplification factor. This is a desirable property of a phase-shift amplifier, and is due to the fact that the phase-noise of the source is not amplified together with the phase-change signal. Another prediction is that when the noise is mutually correlated on the summed signals, the sensitivity is not degraded by amplitude noise $\sigma_n$ which is also a desirable feature.

Figure 16:
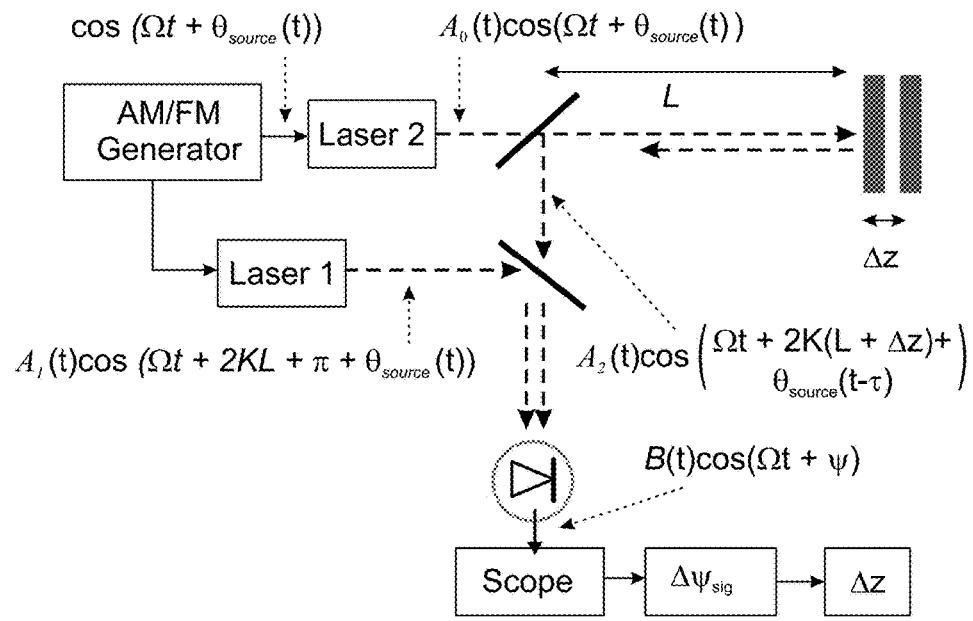
FIG. 16 is a schematic illustration of an experimental system, used in experiments performed according to some embodiments of the present invention.

An optical realization of RF phase-shift amplification with correlated phase noise and uncorrelated amplitude noise according to some embodiments of the present invention is illustrated schematically in FIG. 16.

A signal generator provided sinusoidal amplitude modulation $\cos(\Omega t)$ with f=600 MHz, as well sinusoidal modulation of the phase $\vartheta_{source}(t) = P \cos(\Omega_{pm} t)$. By artificially adding phase noise to the source with peak phase deviation P=0.1 rad, so that its RMS phase deviation is $P/\sqrt{2}$ (for sinusoidal noise), it is ensured that this is the dominant noise in the system (the total system noise without the phase modulation was measured to be 10 dB less than the applied phase noise). This mimics a system in which wider-band noise sources are effectively filtered out with a sufficiently narrow-band filter. The frequency of the phase modulation was set sufficiently low at $f_{pm} = \Omega_{pm}/2\pi = 1$ KHz, to ensure that the condition $f_{pm} \ll 1/2\pi\tau_{path}$ or $\tau_{path} \ll \tau_{corr}$ is fulfilled.

The output of the generator directly modulated the two lasers in the 1550 nm region, each with an output power of about 1 mW. Laser 2 illuminated a mirror and the reflection entered a detector together with a reference beam from Laser 1. In FIG. 16, solid and dashed lines are the electrical and optical signals respectively.

Before moving the mirror, the difference in RF phase between the signal and reference beams at the detector was set to π (by adding a phase delay of 2KL+π to beam 1), and the amplitude ratio Å was set to give the desired $G^0$. The detector output is proportional to the sum of the two RF signals. When blocking either one of the lasers, the detector AC output was 500 mV peak-to-peak. With both lasers operating, the AC output was reduced by a factor $1/G^0$ due to the destructive interference, so that at the maximum gain of 100 the output signal was approximately 5 mV peak-to-peak.

In a first experiment, the peak deviation of the phase-noise on the output phase ψ(t) was measured while varying $G^0$, in order to verify that the dominant phase noise is the sinusoidal phase noise which was impressed on the input, and to prove the prediction that the phase noise is not amplified. This was measured with a spectrum analyzer. Applying the artificial sinusoidal phase noise described above, the spectrum for P≪1 consisted of a carrier at 600 MHz and two sidebands at an offset frequency of ±1 KHz. The ratio between the side-band power and the carrier is 20 log(P/2) dB c, equal to −26 dBc for P=0.1 rad. This ratio was monitored while varying $G^0$.

Figure 17:
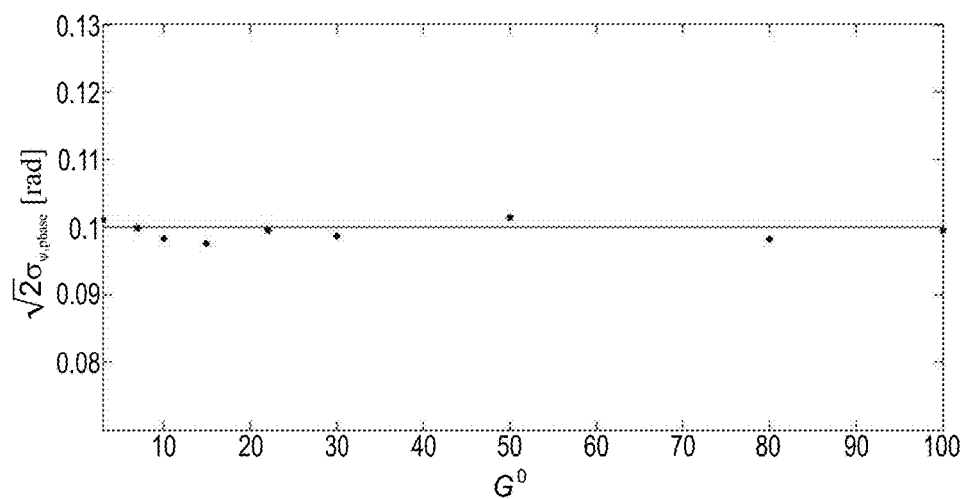
FIG. 17 is a graph showing a peak phase deviation of an output phase noise as obtained in experiments performed according to some embodiments of the present invention.

FIG. 17 is a graph showing the peak phase deviation of the output phase noise as a function of $G^0$. The solid line corresponds to the theory and the dots correspond to the experimental data. As shown, the peak phase deviation of ψ(t), equals to $\sqrt{2}\sigma_{\psi,phase}$ for sinusoidal phase noise, is constant for all $G^0$ and equals to the peak phase deviation P=0.1 rad of the source.

The bandwidth BW of the filter that can ensure sufficient SNR and phase-noise limited operation, is inversely proportional to $G^0$, since the output signal amplitude is also inversely dependent on $G^0$. The present inventors estimate that for $G^0=100$, the bandwidth BW can be set to about 100 kHz.

A second experiment was directed to the verification that the phase-shift amplification technique of the present embodiments can be useful for enhancing the resolution of distance measurement.

Figure 18:
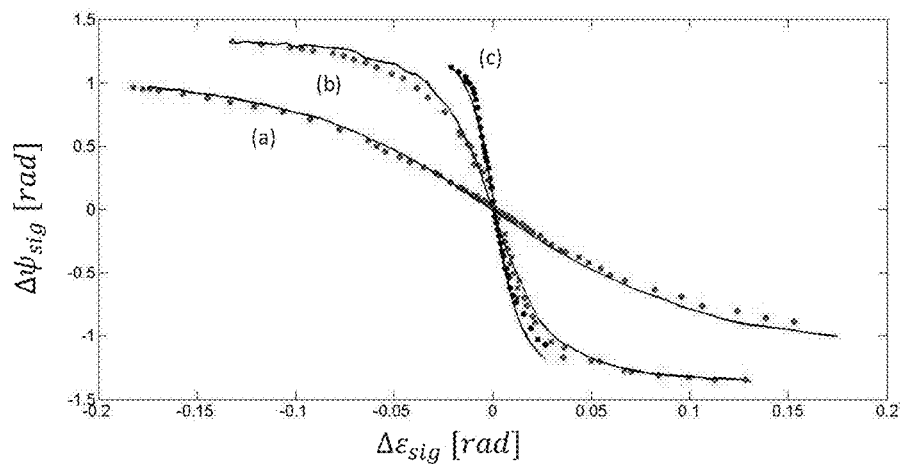
FIG. 18 is a graph showing an output phase-change signal as a function of an input phase-change signal, for three amplification values, as obtained in experiments performed according to some embodiments of the present invention.

In this experiment, the mirror location was varied and the output phase was monitored, for several values of $G^0$. The experimental results are shown in FIG. 18 which is a graph showing the output phase-change signal, $\Delta\psi_{sig}$ as a function of the input phase-change signal, $\Delta\in_{sig}$, for three values of $G^0$: (a) 10, (b) 50 and (c) 100. The solid line corresponds to the theory and the dots correspond to the experimental data. It is noted that for $G^0=100$, a displacement of 8 μm provided $\Delta\in_{sig}=2\times10^{-4}$ rad, which was amplified to a measurable phase change of $\Delta\psi_{sig}=0.02$ rad. These results demonstrate the ability of the technique of the present embodiments to reach micron resolution at sub-GHz modulation.

Figure 19:
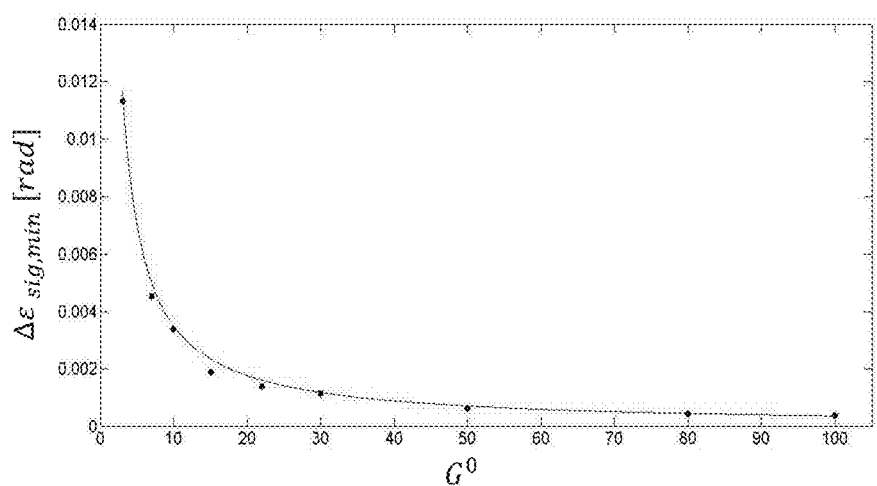
FIG. 19 is a graph showing a minimum detectable phase change as a function of an amplification factor as obtained in experiments performed according to some embodiments of the present invention.

A third experiment was directed to the verification that the sensitivity of the system, e.g., the minimum phase change $\Delta\in_{sig,min}$ that gives an SNR=1 in the presence of the phase noise, improves as $(G^0)^{-1}$. The results are shown in FIG. 19, which is a graph showing the minimum phase change as a function of $G^0$, and which demonstrate that $\Delta\in_{sig,min}$ is proportional to $1/G^0$.

In the present Example, the phase-shift amplification was achieved in the optical domain, by summing the intensity of two beams that are optically incoherent with the use of a beam splitter and an optical detector.

It is to be understood, however, that this amplification can also be achieved electronically, e.g., using an RF summer. Also contemplated are embodiments in which two or more stages of amplification are concatenated, where each amplification stage can be either electronic or optical. Since the output amplitude is reduced by a factor $G^0$, linking more than one stage, with proper signal amplitude amplification and control between the stages, would be a good approach for effectively achieving high phase-shift amplification.

Referring to EQ. (3.12) and applying it to distance measurement, a minimum (SNR=1) length resolution of $$\Delta z_{min} = \frac{c}{4\pi} \frac{1}{G^0} \frac{\sigma_\theta}{f} \quad \text{(EQ. 3.13)}$$

can be obtained.

According to Leeson's equation which describes the phase noise spectrum $L(f-f_0)$ of an oscillator (without flicker noise), $$L(f-f_0) = 10\log\left\{\frac{kTF}{2P_s}\left[1+\left(2Q_L\frac{f-f_0}{f_0}\right)^{-2}\right]\right\} \quad [dBc/Hz] \quad \text{(EQ. 3.14)}$$

where $f_0$ is the center frequency, $Q_L$ denotes the loaded Q of the oscillator, $P_S$ is the oscillator power, F is the device noise figure, T is the temperature in degrees Kelvin and kTF is the noise power density, the oscillator's RMS phase-noise deviation is then $\sigma_\theta = \sqrt{\int_{f_1}^{f_2} 2L(f)df}$. For given $Q_L$, F, T and $P_S$, the oscillator's RMS phase-noise deviation $\sigma_\theta$ is proportional to the RF center frequency, so that $\sigma_\theta/f_0$ is constant.

For example, in typical low-noise generators, such as the commercial LNO320B1 available from Rakon Ltd., New Zealand, the effective phase noise is approximately 0.01° and $\sigma_\theta/f_0 \cong 2\times10^{-12}$ [rad·s]. This corresponds to $$\Delta z_{min} \approx \frac{5\times10^{-5}}{G^0} [m]$$

with an SNR of unity, and reflects best performance without accounting for further additive system noise. For example, for a desired SNR of about 10, and one stage of amplification with $G^0=100$, a resolution of about 5 μm is achievable. By linking two or more stages in series, an effective amplification of $G^0=10^4$ or more can be achieved, providing a resolution of 50 nm or better. The ability to reach nanometric sensitivity with relatively low RF frequencies may ultimately be used as an alternative to coherent optical interferometry or other techniques.

The present Inventors also contemplate use of any of the techniques disclosed, for example, in references 2 and 6-10 as a phase detection stage applied after the phase-shift technique described herein. The present embodiments provide the ability to boost small phase-shifts before the phase detection process takes place, without amplifying the phase noise or amplitude noise as well. Therefore, for any given RF operating frequency, the technique of the present embodiments can reach higher sensitivity than other types of phase amplifiers.

Example 4

Exemplified Two-Stage Amplification

An exemplified system 800 that provides a two-stage amplification in which in a first stage the signal are processed optically and in a second stage the signals are processed electrically have been devised according to some embodiments of the present invention.

In the optical stage, phase amplification is achieved by summing the intensity of two beams that are optically incoherent using a beam splitter and an optical detector. In the electrical stage, phase amplification is achieved electronically, with an electrical combiner.

Figure 20A:
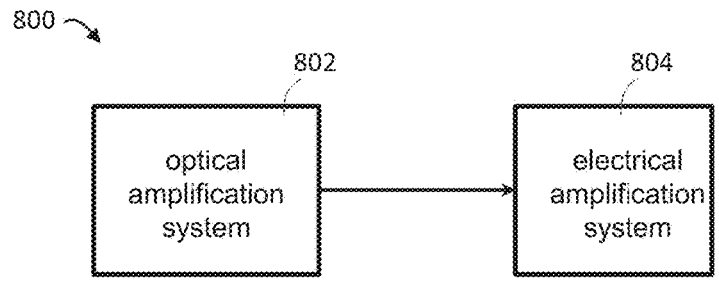
FIGS. 20A, 20B, 20C and 20D are schematic illustrations of an exemplified system that provides a two-stage amplification in which in a first stage the signal are processed optically and in a second stage the signals are processed electrically, according to some embodiments of the present invention.

The two stage amplification system 800 is illustrated in FIGS. 20A-D. FIG. 20A is a conceptual block diagram of the system, showing an optical amplification system 802 and an electrical amplification system 804. The optical amplification system 802 provides a first amplification of the phase shift and the electrical amplification system 804 further amplifies the phase shift.

Figure 20B:
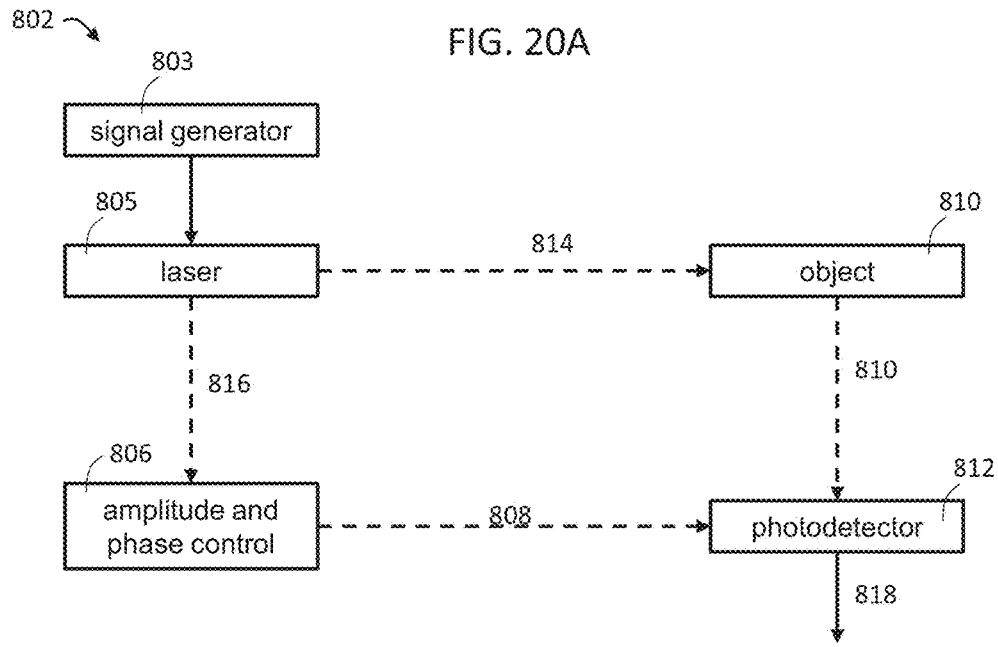

The optical amplification system 802 is schematically illustrated in FIG. 20B. A signal generator 803 provides an electrical signal to a laser device 805. The laser device 204 transmits a transmitted optical beam 814 to an object 810. Beam 814 interacts with object 810 to provide another beam 810. Beam 810 constitutes the signal S (FIG. 1) of amplification system 802. Laser 805 also transmits a beam 816 to an amplitude and phase control 806 at which beam 816 is modulated to provide a reference beam 808. Beam 808 constitutes the reference signal $S_{ref}$ (FIG. 1) of amplification system 802. Both beams 808 and 810 arrive at a photodetector which receives the optical beams and provides an output electrical signal 818 which constitutes a linear combination of S and $S_{ref}$ as further detailed hereinabove. In FIG. 20A, dashed lines represents optical beams and solid lines represent electrical signals.

Figure 20C:
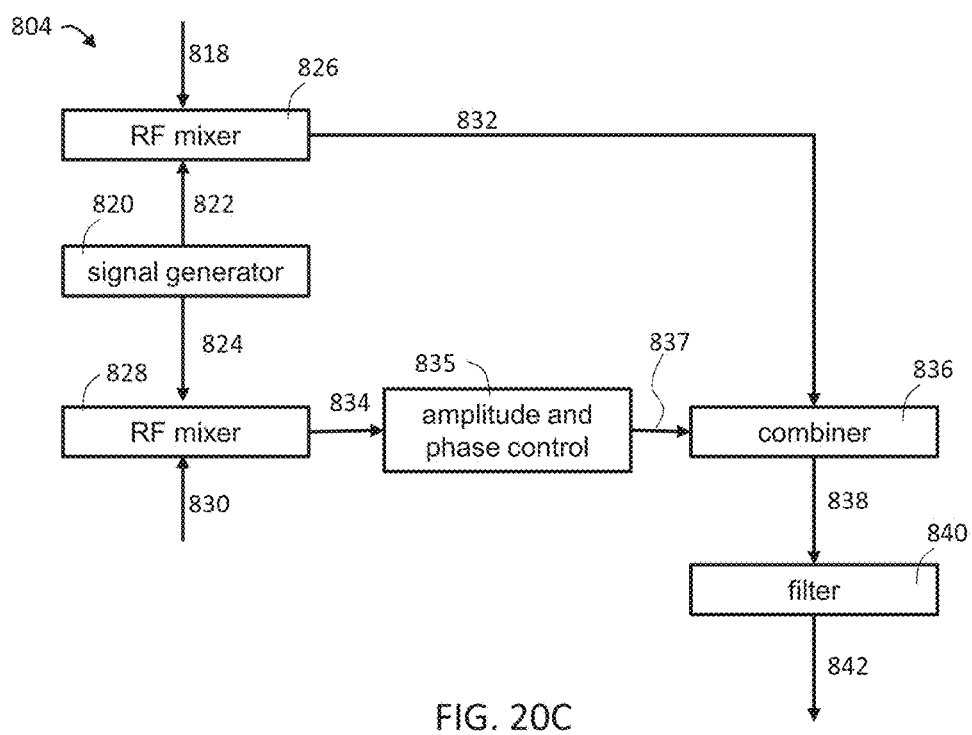
Figure 20D:
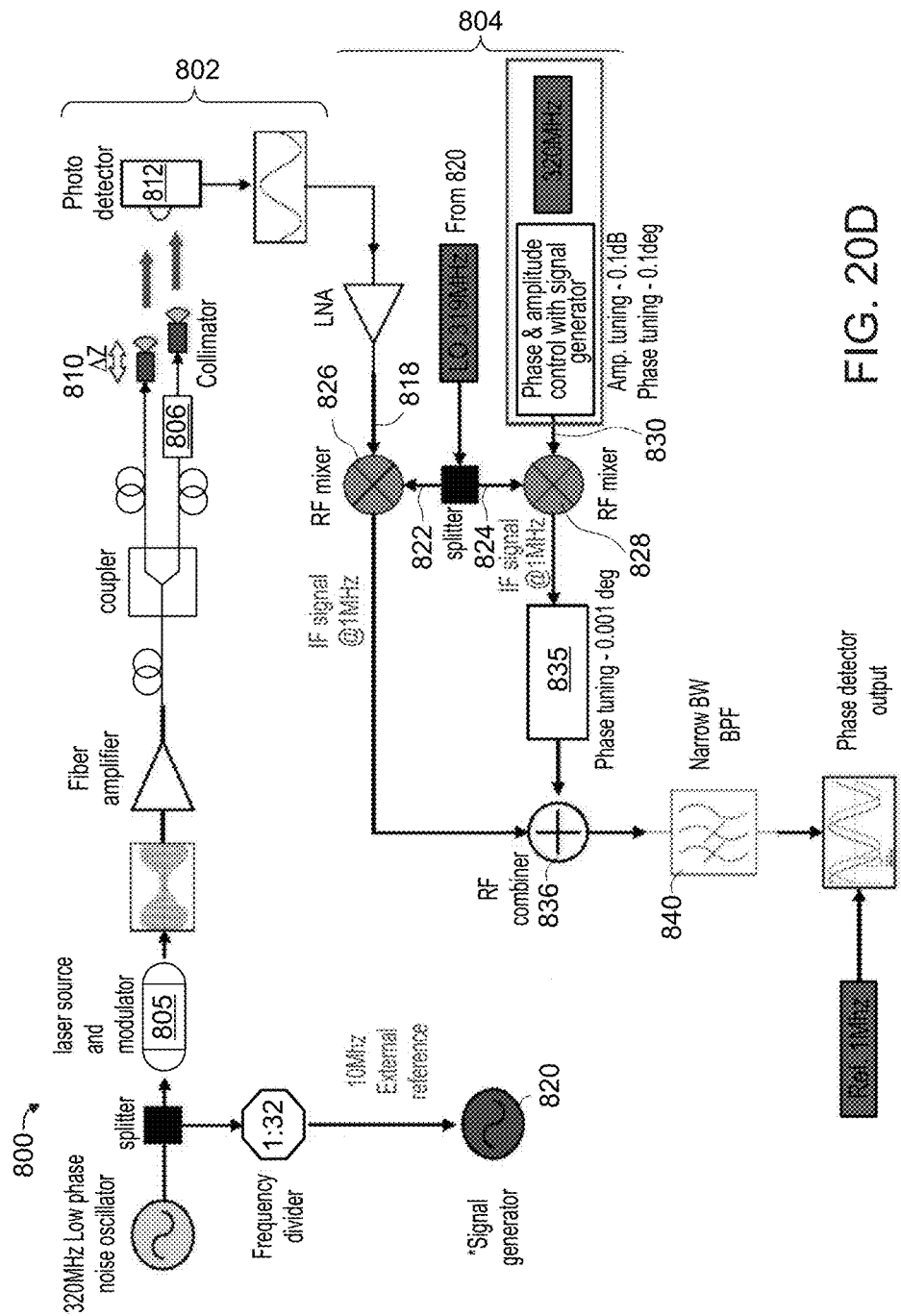

The electrical amplification system 804 is schematically illustrated in FIG. 20C. A signal generator 820 generates signals 822 and 824 at a frequency which is sufficiently close to the signal generated by signal generator 803 of system 802. Denoting the frequency of the signal generated by signal generator 803 by Ω, and the frequency of the signal generated by signal generator 820 by ω, these frequencies optionally and preferably satisfy 0.5 MHz≤Ω−ω≤5 MHz, e.g., Ω−ω=1 MHz. Signal 822 is transmitted to an electrical signal mixer 826 (e.g., an RF mixer), and signal 824 is transmitted to an electrical signal mixer 828 (e.g., an RF mixer). Mixer 826 also receives signal 818 from system 802, and mixer 828 also receives a signal 830 that has the same phase and frequency as signal 816 generated by laser 804 of system 803. Both mixers 826 and 828 mix the signals they receive and output mixed electrical signals, denoted signal 832 and signal 834, respectively. Signal 832 constitutes the signal S (FIG. 1) of amplification system 804.

Since signal 832 is the result of mixing with signal 818, the output of system 802 is used to produce the input of system 804.

Signal 834 is transmitted to an amplitude and phase control 835 at which signal 835 is modulated to provide a reference signal 837. Signal 837 constitutes the reference signal $S_{ref}$ (FIG. 1) of amplification system 804.

Signals 832 and 837 are combined at a signal combiner 836, which outputs a combined signal 838. Typically, combiner 836 is a summing circuit, in which case signal 838 is the sum of signals 832 and 837. Both signals 832 and 837 are at a frequency of about Ω−ω, so that system 804 operates at frequencies that are significantly lower than the frequencies at which system 802 operates. Optionally, signal 838 is filtered by a band pass filter 840 to provide a filtered signal 842. A more detailed illustration of system 800, including both systems 802 and 803 is provided in FIG. 20D.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] Ulrich L. Rohde, *Microwave and Wireless Synthesizers: Theory and Design* (John Wiley and Sons, 1997).
[2] Cam Nguyen and Kim Seoktae, *Theory, Analysis and Design of RF Interferometric Sensors* (Springer, 2012).
[3] Manik Attygalle and Dmitrii Stepanov, "Linear photonic technique for fixed and time varying RF phase shifts of radar signals," Opt. Express 20, 18025 (2012).
[4] J. Yang, E. H. Chan, X. Wang, X. Feng and Guan B., "Broadband photonic microwave phase shifter based on controlling two RF modulation sidebands via a Fourier-domain optical processor", Opt. Express 23, 12100 (2015).
[5] R. A. Minasian, E. H. W. Chan, and X. Yi, "Microwave photonic signal processing," Opt. Express 21, 22918 (2013).
[6] A. De Marcellis, G. Ferri and Elia Palange, "A Novel Analog Autocalibrating Phase-Voltage Converter for Signal Phase-Shifting Detection", IEEE Sensors Journal 11, 259 (2011).
[7] S. P. Natarajan, T. M. Weller and David P. Fries, "Sensitivity Tunable Inductive Fluid Conductivity Sensor Based on RF Phase Detection", IEEE Sensors Journal 7, 1300 (2007).
[8] Jong-Ryul Yang, "Measurement of Amplitude and Phase Differences Between Two RF Signals by Using Signal Power Detection", IEEE Microwave and Wireless Components Letters 24, 206 (2014).
[9] Bin Lia, Fengguang Luob, Ming Tianb and Lu Shib, "Fiber chromatic dispersion measurement by using a novel RF spectrum phase detection method based on DSP", Opt. Commun. 285, 3249 (2012).
[10] Karl Will and Abbas Omar, "Phase-Shifting Interferometry for RF Phase Measurement", IEEE Trans. Microwave Theory and Techniques, 56, 2642, (2008).
[11] G. Perchet, M. Lescure, T. Bosch, "Magnification of phase shift for laser distance measurement", IEEE Instrumentation and Measurement Technology Conference, IMTC/97, Vol. 1, 617, (1997).
[12] D. B. Leeson, "A Simple Model of Feedback Oscillator Noise Spectrum", Proceedings of the IEEE 54 (2), 329 (1966).

What is claimed is:

1. A method of amplifying a phase shift, the method comprising:
   receiving an input signal in response to a transmitted output signal;
   generating a reference signal;
   varying a modulation of at least one of the signals such that a ratio between modulation amplitudes of the input signal and the reference signal is at least 0.9 and at most 1.1, and a phase difference between the reference signal and the input signal is from about $0.9\pi$ to about $1.1\pi$;
   forming an output signal which comprises a sum of the reference signal and the input signal, following said variation; and
   filtering said output signal by a bandpass filter to form a filtered output signal, wherein a bandwidth of said bandpass filter is selected such that XG<0.1, wherein X is a noise fluctuation average of said filtered output signal, and G is an expected amplification factor of a phase shift between said input signal and said reference signal.

2. The method according to claim 1, further comprising measuring a phase of said output signal relative to the reference signal.

3. The method according to claim 1, further comprising measuring a change of phase of said output signal over time.

4. The method according to claim 1, wherein said bandwidth is of at most $f/\sqrt{G}$ wherein f is a frequency of said output signal.

5. The method according to claim 1, further comprising repeating said variation and said formation, using said output signal for generating an input signal for said repetition.

6. The method according to claim 1, wherein said input signal and said reference signal are optical signals, wherein said output signal is an electrical signal, and wherein the method comprises generating an electrical reference signal and repeating said variation and said formation, using said electrical output signal and said electrical reference signal.

7. A system for amplifying a phase shift, the system comprising:
   a transmitter for transmitting output signal, and a receiver for receiving an input signal in response to said transmitted signal;
   a reference signal generator for generating a reference signal;
   a modulation circuit, configured for varying a modulation of at least one of the signals such that a ratio between modulation amplitudes of the input signal and the reference signal is at least 0.9 and at most 1.1, and a phase difference between the reference signal and the input signal is from about $0.9\pi$ to about $1.1\pi$;
   a signal combiner configured for summing the signals, following said variation; and
   a bandpass filter for filtering said output signal to form a filtered output signal, wherein a bandwidth of said bandpass filter is selected such that XG<0.1, wherein X is a noise fluctuation average of said filtered output signal, and G is an expected amplification factor of a phase shift between said input signal and said reference signal.

8. The system according to claim 7, further comprising a phase detector circuit configured for measuring a phase of said output signal relative to the reference signal.

9. The system according to claim 7, further comprising phase-change detector circuit configured for measuring a change of phase of said output signal over time.

10. The system according to claim 7, wherein said bandwidth is of at most $f/\sqrt{G}$ wherein f is a frequency of said output signal.

11. The system according to claim 7, further comprising an additional modulation circuit and an additional signal combiner configured for repeating said variation and said formation, using said output signal for generating as an input signal for said repetition.

12. The system according to claim 7, wherein said input signal and said reference signal are optical signals, wherein said output signal is an electrical signal, and wherein the system comprises an electrical reference signal generator for generating an electrical reference signal, an electrical modulation circuit configured for varying a modulation of at least one of the electrical output signal and the electrical reference signal, and an electrical signal combiner for forming a linear combination of the electrical output signal and the electrical reference signal, following said variation.

13. The method according to claim 1, wherein said linear combination is formed by a signal summing circuit.

14. The method according to claim 1, wherein said linear combination is formed optically.

15. The method according to claim 1, wherein said linear combination is formed by multiplying said signal to provide a multiplication signal, and extracting from said multiplication signal components being linearly proportional to each of said signals.

16. A system for measuring an internal structure of an object, comprising the system according to claim 7.

17. A system for measuring a distance to an object, comprising the system according to claim 7.

18. A system for measuring a motion characteristic, comprising the system according to claim 7.

19. An interferometer system, comprising the system according to claim 7.

20. A system for measuring flow, comprising the system according to claim 7.

21. A radiofrequency transceiver, comprising the system according to claim 7.

22. An optical transceiver, comprising the system according to claim 7.

23. A communication system, comprising the system according to claim 7.

24. The method according to claim 1, wherein each of the reference signal and said input signal is carried by a carrier electrical signal, and wherein a modulation frequency of both the reference signal and said input signal is at least 10 times lower than a carrier frequency of said carrier electrical signal.

25. The method according to claim 1, wherein each of the reference signal and said input signal is carried by a carrier ultrasound signal, and wherein a modulation frequency of both the reference signal and said input signal is at least 10 times lower than a carrier frequency of said carrier ultrasound signal.

26. The method according to claim 1, wherein each of the reference signal and said input signal is carried by a carrier optical signal, and wherein a modulation frequency of both the reference signal and said input signal is at least 10 times lower than a carrier frequency of said carrier optical signal.

27. The method according to claim 1, wherein each of the reference signal and said input signal is an unmodulated continuous wave carrier signal.

* * * * *